US009836392B2

(12) United States Patent
Adachi et al.

(10) Patent No.: US 9,836,392 B2
(45) Date of Patent: Dec. 5, 2017

(54) STORAGE CONTROL APPARATUS TO CONTROL PRE-PROCESSING OPERATIONS

(71) Applicant: Sony Corporation, Tokyo (JP)

(72) Inventors: Naohiro Adachi, Tokyo (JP); Keiichi Tsutsui, Kanagawa (JP); Kenichi Nakanishi, Tokyo (JP); Hideaki Okubo, Saitama (JP); Yasushi Fujinami, Tokyo (JP); Ken Ishii, Tokyo (JP)

(73) Assignee: SONY CORPORATION, Tokyo (JP)

( * ) Notice: Subject to any disclaimer, the term of this patent is extended or adjusted under 35 U.S.C. 154(b) by 60 days.

(21) Appl. No.: 14/692,233

(22) Filed: Apr. 21, 2015

(65) Prior Publication Data

US 2015/0227459 A1    Aug. 13, 2015

Related U.S. Application Data

(63) Continuation of application No. 13/780,774, filed on Feb. 28, 2013, now Pat. No. 9,058,162.

(30) Foreign Application Priority Data

Mar. 23, 2012 (JP) ................................ 2012-066657
Aug. 7, 2012 (JP) ................................ 2012-174561

(51) Int. Cl.
*G06F 12/00* (2006.01)
*G06F 12/02* (2006.01)
(Continued)

(52) U.S. Cl.
CPC ........ *G06F 12/0246* (2013.01); *G06F 9/3004* (2013.01); *G06F 12/0238* (2013.01);
(Continued)

(58) Field of Classification Search
CPC ............. G06F 12/0246; G06F 12/0238; G06F 9/3004; G06F 13/0069; G06F 13/0097;
(Continued)

(56) References Cited

U.S. PATENT DOCUMENTS 7,260,672 B2 *    8/2007 Garney .................. G06F 21/79
                                                            705/51
7,539,048 B2 *    5/2009 Farnworth ......... G11C 13/0004
                                                           365/148

(Continued)

FOREIGN PATENT DOCUMENTS

CN          101075629 A       11/2007
JP          07-334992 A       12/1995
(Continued)

OTHER PUBLICATIONS

Office Action for CN Patent Application No. 201310080560.8, dated Dec. 30, 2016, 11 pages of Office Action and 14 pages of English Translation.

*Primary Examiner* — Shawn X Gu
(74) *Attorney, Agent, or Firm* — Chip Law Group

(57) ABSTRACT

A storage control apparatus includes: a pre-processing-execution determining block for determining whether or not either one of an erase operation and a program operation is to be executed as pre-processing in a write operation to be carried out on a predetermined data area to serve as a write-operation object; and a pre-read processing block for reading out pre-read data from the data area prior to the write operation if a result of the determination indicates that the pre-processing is to be executed. The apparatus further includes a bit operating block for carrying out: the pre-processing and one of the erase and program operations which is not the pre-processing as post-processing if a result of the determination indicates that the pre-processing is to be executed; and the post-processing without carrying out the
(Continued)

pre-processing if a determination result indicates that the pre-processing is not to be executed.

16 Claims, 14 Drawing Sheets

(51) Int. Cl.
*G06F 9/30* (2006.01)
*G11C 16/34* (2006.01)
*G11C 13/00* (2006.01)

(52) U.S. Cl.
CPC ...... *G11C 13/0069* (2013.01); *G11C 13/0097* (2013.01); *G11C 16/3436* (2013.01); *G06F 2212/7201* (2013.01); *G06F 2212/7202* (2013.01); *G06F 2212/7203* (2013.01); *G06F 2212/7205* (2013.01); *G06F 2212/7207* (2013.01); *G06F 2212/7209* (2013.01); *G06F 2212/7211* (2013.01); *G11C 2013/0076* (2013.01)

(58) Field of Classification Search
CPC ..... G06F 2212/7201; G06F 2212/7202; G06F 2212/7203; G06F 2212/7205; G06F 2212/7207; G06F 2212/7209; G06F 2212/7211; G11C 16/3436; G11C 2013/0076

See application file for complete search history.

(56) References Cited

U.S. PATENT DOCUMENTS

| | | | |
|---|---|---|---|
| 9,058,162 B2 * | 6/2015 | Adachi | ........... G06F 9/3004 |
| 2010/0122047 A1 * | 5/2010 | Vasilievna | ........... G06F 3/0623 |
| | | | 711/155 |
| 2011/0066900 A1 | 3/2011 | Tokiwa | |

FOREIGN PATENT DOCUMENTS

| | | |
|---|---|---|
| JP | 2011-060388 | 3/2011 |
| WO | 2010/144587 A2 | 12/2010 |

* cited by examiner

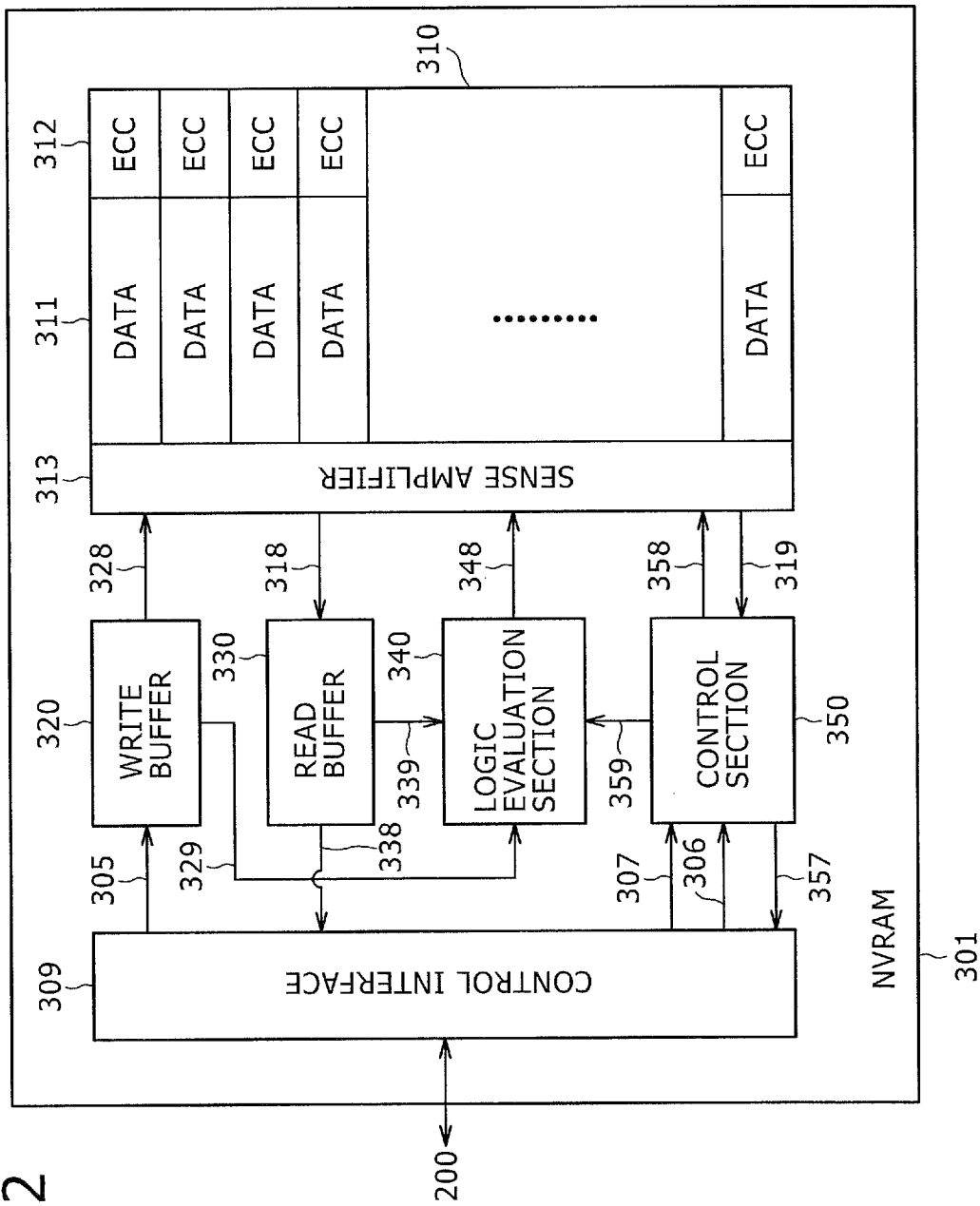
F I G . 2

FIG.8

| LOGICAL ADDRESS (221) | PHYSICAL ADDRESS (222) | Trim FLAG (223) | ERASE FLAG (224) |
|---|---|---|---|
| LOGICAL ADDRESS | PHYSICAL ADDRESS | Trim FLAG | ERASE FLAG |
| LOGICAL ADDRESS | PHYSICAL ADDRESS | Trim FLAG | ERASE FLAG |
| ⋮ | ⋮ | ⋮ | ⋮ |
| LOGICAL ADDRESS | PHYSICAL ADDRESS | Trim FLAG | ERASE FLAG |

STORAGE CONTROL APPARATUS TO CONTROL PRE-PROCESSING OPERATIONS

CROSS-REFERENCE TO RELATED APPLICATIONS

This application is a continuation of U.S. application Ser. No. 13/780,774, filed on Feb. 28, 2013, now U.S. Pat. No. 9,058,162, which claims priority from Japanese Priority Patent Application Nos. JP 2012-066657 and JP 2012-174561 filed in the Japan Patent Office on Mar. 23, 2012 and Aug. 7, 2012, respectively, the entire content of which are hereby incorporated by reference.

BACKGROUND

The present disclosure relates to a storage control apparatus. More specifically, the present disclosure relates to a storage control apparatus for a non-volatile memory, a storage apparatus employing the storage control apparatus, an information processing system employing the storage apparatus, a processing method provided for the storage control apparatus and a program to be executed by a computer for implementing the method.

In an information processing system, typically, a DRAM (Dynamic Random Access Memory) is used as a work memory. This DRAM is normally a volatile memory. That is to say, when the power supply of the DRAM is turned off, data stored in the DRAM is lost. In recent years, however, an NVM (Non-Volatile Memory) is used. The non-volatile memories are classified into two large categories. The first category is a flash memory which allows a storage unit with a large size to be used as an access unit in accesses to data stored in the memory. On the other hand, the second category is an NVRAM (Non-Volatile Random Access Memory) which allows a storage unit with a small size to be used as an access unit in accesses made at a high speed as random accesses to data stored in the memory. A representative of the flash memory is a NAND-type flash memory. On the other hand, typical examples of the non-volatile random access memory are a ReRAM (Resistance RAM), a PCRAM (Phase-Change RAM) and an MRAM (Magneto Resistive RAM).

The ReRAM is a non-volatile memory making use of a variable-resistance device. In the case of the ReRAM, it is not necessary to carry out an operation to erase data in block units prior to a data write operation. That is to say, it is possible to write data directly into only a desired page. At this point, the ReRAM is different from the NAND-type flash memory and the like which need to store a threshold value according to the amount of electric charge stored in a floating gate as data. The variable-resistance device can be used for storing 1-bit information by putting the device in one of two states, that is, an HRS (High Resistance State) and an LRS (Low Resistance State). However, the variable-resistance device has a problem that, if a voltage having the same polarity is applied to the variable-resistance device consecutively a number of times, the resistance of the device undesirably changes, deranging a resistance distribution. When the number of times the voltage having the same polarity is applied to the variable-resistance device increases for example, an HRS undesirably changes to an LRS and an LRS undesirably changes to an HRS. If the resistance of the variable-resistance device changes as described above, when a voltage having an opposite polarity is applied to the device after the voltage having the same polarity, with the voltage having a normal magnitude, it is feared that data cannot be stored in the device correctly or it is necessary to apply a voltage having a large absolute value to the device in order to store data correctly. In order to solve this problem, there is provided a write method disclosed in documents such as Japanese Patent Laid-open No. 2011-060388. According to this method, in the existing write operation, already written data is read out and compared with data to be written. Then, in accordance with the result of the comparison, only necessary bits selected from the already written data are written and/or erased.

SUMMARY

In accordance with the existing technology described above, in the existing write operation, already written data is read out and compared with data to be written. Then, in accordance with the result of the comparison, only necessary bits selected from the already written data are erased and/or programmed. In this way, it is not necessary to apply a voltage having the same polarity consecutively to the device. If already written data is read out to be compared with data to be written and, then, in accordance with the result of the comparison, only necessary bits selected from the already written data are erased and/or programmed more than necessary as pre-processing in every write operation, however, the speed of the write operation decreases.

It is desirable to suppress the write-operation speed decrease caused by pre-processing carried out on a data area serving as a write-operation object.

The present disclosure is made for solving the problems raised by the existing technology as described above. In accordance with a first mode of the present disclosure, there is provided a storage control apparatus including:

a pre-processing-execution determining block configured to determine whether or not either one of an erase operation and a program operation is to be executed as pre-processing in a write operation to be carried out on a predetermined data area included in a memory cell to serve as a write-operation object;

a pre-read processing block configured to read out pre-read data from the data area included in the memory cell to serve as a write-operation object prior to the write operation if a result of the determination indicates that the pre-processing is to be executed; and a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed.

In addition, in accordance with the first mode of the present disclosure, there is also provided a processing method to be adopted by the storage control apparatus.

Thus, if a result of the determination indicates that pre-processing is not necessary in the write operation for the memory cell, the pre-processing can be omitted. As a result, the present disclosure brings about an effect that the write operation can be carried out in a short period of time.

In addition, in accordance with the first mode of the present disclosure, in every bit of the memory cell, a first value or a second value can be stored and the pre-processing is processing to set the first value in each of the bits of the memory cell whereas the post-processing is processing to set the second value in any of the bits of the memory cell.

On top of that, in accordance with the first mode of the present disclosure, the pre-processing-execution determining block determines whether or not an erase operation or a program operation is to be executed on the basis of a control signal received from an external source. Thus, it is possible to provide a function to determine whether or not an erase operation or a program operation needs to be executed in accordance with the source external to the storage control apparatus.

In addition, in accordance with the first mode of the present disclosure, the storage control apparatus further has a flag holding section configured to hold an erase flag, which indicates that an erase operation has been completed, for every predetermined data area of the memory cell. In this case, the pre-processing-execution determining block determines that:

the pre-processing is not to be executed on a data area included in a memory cell to serve as a write-operation object if the erase flag indicates that the erase operation has been completed for the data area; and the pre-processing is to be executed on a data area included in a memory cell to serve as a write-operation object if the erase flag does not indicate that the erase operation has been completed for the data area.

Thus, if an erase operation has been completed for a data area included in a memory cell to serve as a write-operation object, the execution of the erase operation as pre-processing can be omitted. As a result, the present disclosure brings about an effect that the write operation can be carried out in a short period of time.

On top of that, in accordance with the first mode of the present disclosure, when a command having a field used for indicating whether or not the pre-processing is to be executed is issued, the pre-processing-execution determining block refers to the field in order to determine whether or not the pre-processing is to be executed. Thus, the present disclosure brings about an effect that the determination as to whether or not the pre-processing is to be executed is clearly indicated by the command.

In addition, in accordance with the first mode of the present disclosure, the storage control apparatus further has a processor configured to carry out an erase operation on an unused data area reported by a received command in accordance with the received command. In this case, the pre-processing-execution determining block determines that the pre-processing is not to be executed on a data area included in a memory cell to serve as a write-operation object if the erase operation has been completed for the data area in accordance with the command.

Thus, if an erase operation has been completed for a data area, which is included in a memory cell to serve as a write-operation object, in accordance with the received command for reporting the data area as an unused data area, the execution of the erase operation as pre-processing can be omitted. As a result, the present disclosure brings about an effect that the write operation can be carried out in a short period of time.

On top of that, in accordance with the first mode of the present disclosure, the storage control apparatus further has a processor configured to carry out an erase operation on a data area specified in a received command in accordance with the received command for erasing user data from the data area. In this case, the pre-processing-execution determining block determines that the erase operation is not to be executed as the pre-processing on a data area included in a memory cell to serve as a write-operation object if the erase operation has been completed for the data area in accordance with the command.

Thus, if an erase operation has been completed for a data area, which is included in a memory cell to serve as a write-operation object, in accordance with the received command for erasing user data from the data area, the execution of the erase operation as pre-processing can be omitted. As a result, the present disclosure brings about an effect that the write operation can be carried out in a short period of time.

In addition, in accordance with a second mode of the present disclosure, there is provided a storage apparatus including:

a memory cell;

a pre-processing-execution determining block configured to determine whether or not either one of an erase operation and a program operation is to be executed as pre-processing in a write operation to be carried out on a predetermined data area included in the memory cell to serve as a write-operation object;

a pre-read processing block configured to read out pre-read data from the data area included in the memory cell to serve as a write-operation object prior to the write operation if a result of the determination indicates that the pre-processing is to be executed; and a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed.

Thus, if a result of the determination indicates that pre-processing is not necessary in the write operation for the memory cell, the pre-processing can be omitted. As a result, the present disclosure brings about an effect that the write operation can be carried out in a short period of time.

It is to be noted that, in the storage apparatus according to the second mode of the present disclosure, the memory cell can be a variable-resistance device.

In addition, in accordance with a third mode of the present disclosure, there is provided an information processing system including:

a memory cell;

a pre-processing-execution determining block configured to determine whether or not either one of an erase operation and a program operation is to be executed as pre-processing in a write operation to be carried out on a predetermined data area included in the memory cell to serve as a write-operation object;

a pre-read processing block configured to read out pre-read data from the data area included in the memory cell to serve as a write-operation object prior to the write operation if a result of the determination indicates that the pre-processing is to be executed;

a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed; and a host computer configured to issue a read command or a write command to the memory cell.

Thus, if a result of the determination indicates that pre-processing is not necessary in the write operation according to the write command issued by the host computer to the memory cell, the pre-processing can be omitted. As a result, the present disclosure brings about an effect that the write operation can be carried out in a short period of time.

In accordance with the present disclosure, it is possible to demonstrate an excellent effect of suppressing the write-operation speed decrease caused by pre-processing carried out on a data area serving as a write-operation object.

BRIEF DESCRIPTION OF THE DRAWINGS

FIG. 2 is a block diagram showing a typical configuration of an NVRAM (Non-Volatile Random Access Memory) according to an embodiment of the present disclosure;

FIG. 8 is a diagram showing a typical management information table used in an embodiment of the present disclosure;

DETAILED DESCRIPTION OF THE PREFERRED EMBODIMENTS

Embodiments of the present disclosure are described below. The description is divided into topics arranged as follows.

1. First Embodiment (A typical configuration in which an external signal requests omission of pre-processing)
2. Second Embodiment (A typical configuration in which a Trim command is used)
3. Third Embodiment (A typical configuration in which a Secure Erase command is used)
4. Fourth Embodiment (A typical configuration in which erase and program operations are carried out by using pre-read data)
5. Fifth Embodiment (A typical configuration in which erase and program operations are verified at the same time)

1. First Embodiment

[Configuration of an Information Processing System]

Figure 1:
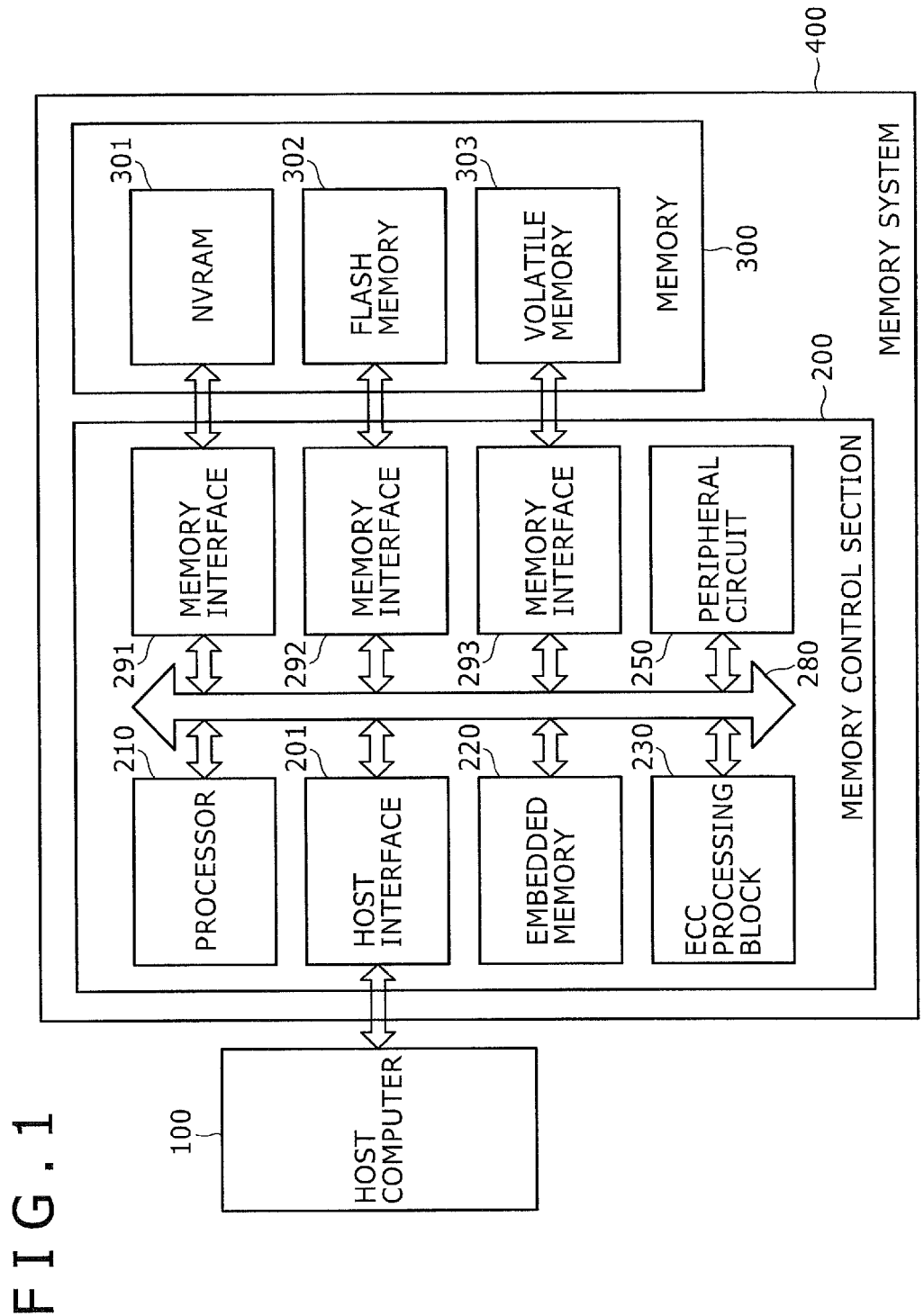
FIG. 1 is a block diagram showing a typical configuration of an information processing system according to an embodiment of the present disclosure.

FIG. 1 is a block diagram showing a typical configuration of an information processing system according to an embodiment of the present disclosure. As shown in the figure, the information processing system includes a host computer 100, a memory 300 and a memory control section 200. The memory control section 200 and the memory 300 form a memory system 400. The host computer 100 issues a read command to the memory system 400 in order to read out data from the memory 300. In addition, the host computer 100 also issues a write command to the memory system 400 in order to write data into the memory 300.

The memory 300 includes non-volatile memories in addition to an ordinary volatile memory 303. The non-volatile memories are classified into two large categories. The first category is a flash memory 302 which allows a storage unit with a large size to be used as an access unit in accesses to data stored in the memory. On the other hand, the second category is an NVRAM (Non-Volatile Random Access Memory) 301 which allows a storage unit with a small size to be used as an access unit in accesses made at a high speed as random accesses to data stored in the memory. A representative of the flash memory 302 is a NAND-type flash memory. On the other hand, typical examples of the NVRAM 301 are a ReRAM (Resistance RAM), a PCRAM (Phase-Change RAM) and an MRAM (Magneto Resistive RAM). In this embodiment, it is assumed that the NVRAM 301 is a ReRAM particularly making use of a variable-resistance device. The volatile memory 303 is used as a work area. In addition, the volatile memory 303 is also used for storing data provided for the purpose of management. On top of that, the volatile memory 303 can also be used as a cache memory. The volatile memory 303 can be implemented as typically a DRAM or an SRAM. Before the power supply of the volatile memory 303 is turned off, data stored in the volatile memory 303 is copied in advance to the NVRAM 301 or the flash memory 302 if necessary so that, when the power supply is turned on later, the data copied to the NVRAM 301 or the flash memory 302 can be reused.

The memory control section 200 includes a processor 210, an embedded memory 220, an ECC processing block 230, a peripheral circuit 250, a host interface 201 and memory interfaces 291 to 293. The processor 210, the embedded memory 220, the ECC processing block 230, the peripheral circuit 250, the host interface 201 and the memory interfaces 291 to 293 are connected to each other by making use of a bus 280.

The processor 210 is a section for decoding a control command received from the host computer 100 and carrying out an operation based on the result of the decoding. To be more specific, the processor 210 executes a program stored in a storage area of the embedded memory 220 in accordance with the control command. That is to say, the processor 210 makes use of the storage area of the embedded memory 220 as a program storing area and a work area during the execution of the program according to the control command.

The embedded memory 220 is a memory including an embedded ROM and an embedded RAM which are not shown in the figure. A program can be stored in the embedded ROM. As an alternative, a program can be stored in the NVRAM 301 or the flash memory 302. A program stored in the NVRAM 301 or the flash memory 302 is transferred from the NVRAM 301 or the flash memory 302 to the embedded RAM at an activation time of the information processing apparatus. The embedded RAM is used in a variety of applications. For example, the embedded RAM is used as the work area or an area for temporarily storing management data or the like.

The ECC processing block 230 is a section for generating ECCs (Error Correction Codes) and carrying out error corrections based on the ECCs. That is to say, the ECC processing block 230 corrects errors by adding the ECCs to each piece of data. The ECC processing block 230 can be implemented as hardware or implemented in the processor 210 by execution of a program.

The peripheral circuit 250 is a peripheral circuit of the processor 210. The peripheral circuit 250 typically includes, among others, an embedded timer and a GPIO (General Purpose Input/Output) unit.

The host interface 201 is an interface placed between the host computer 100 and the memory system 400 to serve as an interface for carrying out interactions between the host computer 100 and the memory system 400. The memory system 400 is connected to the host computer 100 through the host interface 201. The memory system 400 receives a control command for controlling the memory 300 from the host computer 100 through the host interface 201 and operates in accordance with control based on the control command. The host interface 201 can be implemented by making use of typically a SATA (Serial Advanced Technology Attachment), a PCI Express (Peripheral Component Interconnect Express), an eMMC (Embedded Multi Media Card), a USB (Universal Serial Bus) or the like.

The memory interface 291 is an interface for carrying out interactions with the NVRAM 301 whereas the memory interface 292 is an interface for carrying out interactions with the flash memory 302. On the other hand, the memory interface 293 is an interface for carrying out interactions with the volatile memory 303.

The memory system 400 carries out an operation to write data into the memory 300 in accordance with a write command received from the host computer 100. In addition, the memory system 400 also carries out an operation to read out data from the memory 300 in accordance with a read command received from the host computer 100. Each of the write and read commands includes a parameter specifying a logical start address and a parameter specifying the size of the data. The logical start address is the address of the beginning of the data. When the memory system 400 receives data to be written in accordance with a write command from the host computer 100, the memory system 400 adds an ECC to the data before storing the data into the non-volatile memory which is the NVRAM 301 or the flash memory 302.

FIG. 2 is a block diagram showing a typical configuration of the NVRAM (Non-Volatile Random Access Memory) 301 according to an embodiment of the present disclosure. As shown in the figure, the NVRAM 301 includes a memory array 310, a sense amplifier 313, a write buffer 320, a read buffer 330, a logic evaluation section 340, a control section 350 and a control interface 309.

The control interface 309 is an interface connecting the NVRAM 301 to the memory control section 200. The control interface 309 is connected to the write buffer 320, the read buffer 330, the logic evaluation section 340 and the control section 350.

The memory array 310 is an array of memory cells arranged to form a lattice. Each of the memory cells is used for storing predetermined information of 1 bit. Thus, a memory cell of the memory array 310 is a variable-resistance memory composed of a variable-resistance device. The memory array 310 is configured to include a plurality of pages. Each of the pages has a data area used for storing data 311 and an ECC area used for storing an ECC 312 added to the data stored in the data area. Data is read out from the memory array 310 by way of the sense amplifier 313 and written into the memory array 310 also by way of the sense amplifier 313.

The sense amplifier 313 is an amplification circuit for amplifying a voltage applied by the memory array 310. The sense amplifier 313 is connected to the write buffer 320, the read buffer 330, the logic evaluation section 340 and the control section 350.

The write buffer 320 is a buffer used for temporarily storing data to be written into the memory array 310 through the sense amplifier 313. The write buffer 320 receives the data to be written into the memory array 310 from the control interface 309 which supplies the data to the write buffer 320 through a signal line 305. Later on, the write buffer 320 supplies the data to be written into the memory array 310 to the sense amplifier 313 through a signal line 328.

The read buffer 330 is a buffer used for temporarily storing data read out from the memory array 310 by way of the sense amplifier 313. In the case of execution of a write operation, if necessary, the read buffer 330 is used for temporarily storing pre-read data read out from the memory array 310 by way of the sense amplifier 313 prior to the write operation. The read buffer 330 receives the data (or the pre-read data) from the sense amplifier 313 which supplies the data to the read buffer 330 through a signal line 318. Later on, the read buffer 330 supplies the data to the control interface 309 through a signal line 338.

The logic evaluation section 340 is a section for carrying out logic evaluation based on data stored in the write buffer 320 and read buffer 330 in order to generate mask data. The logic evaluation section 340 supplies the mask data generated thereby to the memory array 310 through a signal line 348.

The control section 350 is a controller for controlling the other sections employed in the NVRAM 301. The control section 350 is implemented as typically a sequencer. The control section 350 receives a command such as a read or write command from the control interface 309 through a signal line 306 and gives a response to the received command to the control interface 309 through signal line 357. In addition, the control section 350 gives a control signal to the sense amplifier 313 through a signal line 358 and receives a response to the control signal from the sense amplifier 313 through a signal line 319. On top of that, the control section 350 gives a control signal to the logic evaluation section 340 through a signal line 359.

In addition, the control section 350 receives a command such as a command to omit pre-processing from the control interface 309 through a signal line 307 and, in accordance with this signal, controls the memory array 310 and the logic evaluation section 340 through the signal lines 358 and 359 respectively to omit the pre-processing. The pre-processing is an erase or program operation carried out in advance on a data area serving as the object of a write operation in accordance with pre-read data in the case of the write operation. Normally, in the case of a write operation, an erase operation and a program operation are carried out successively in accordance with pre-read data in order to eventually execute the write operation after a pre-read operation which is performed to read out the pre-read data in advance from the data area. In the case of the embodiment of the present disclosure, on the other hand, if the data area serving as the object of a write operation is found out in advance to have a predetermined value, the pre-read operation is omitted and either the erase operation or the program operation is omitted as the pre-processing. For example, if the erase operation is omitted as the pre-processing, the program operation is carried out as post-processing as is the case with a typical write operation shown in FIG. 4B.

Figure 3:
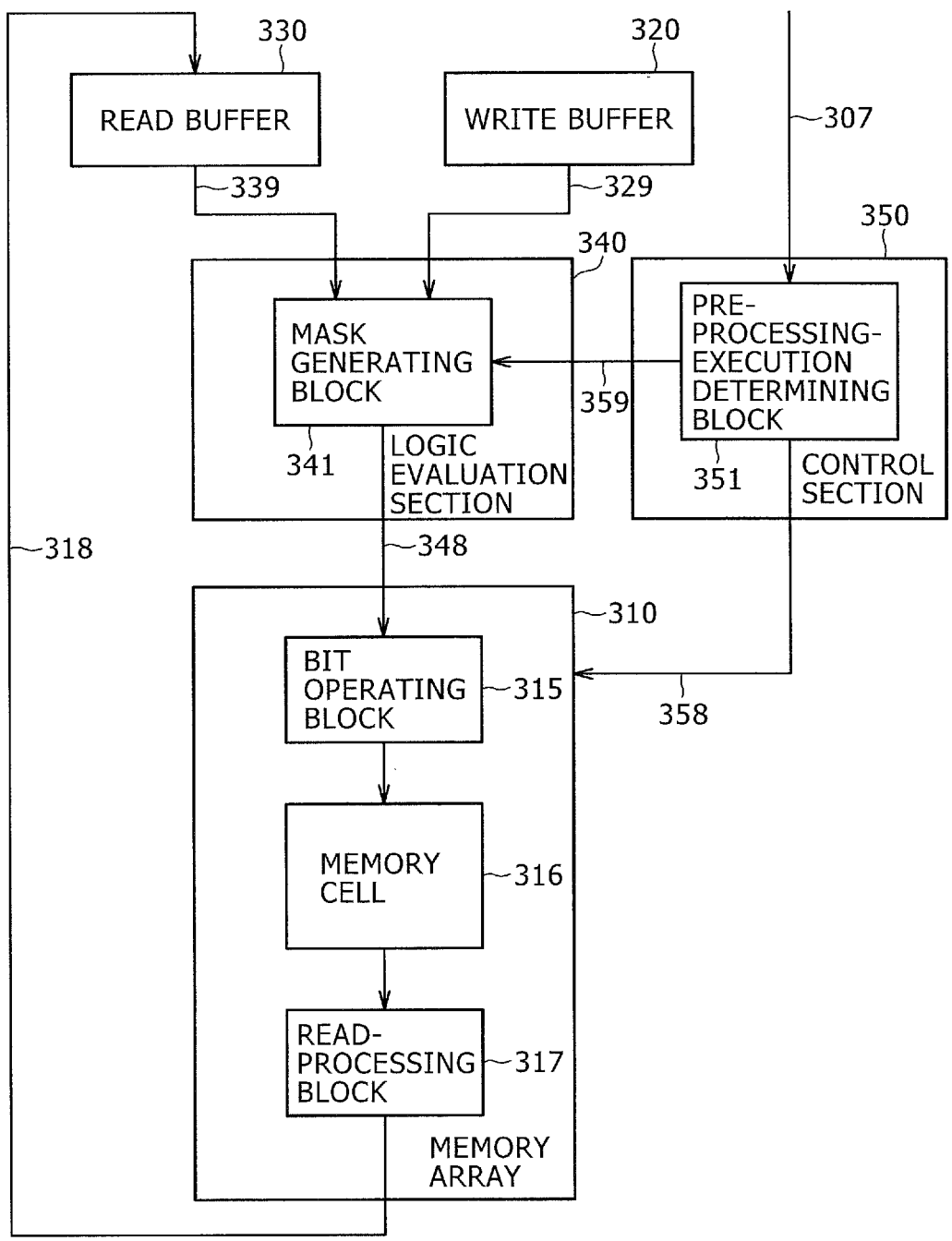
FIG. 3 is a block diagram showing a typical functional configuration of an embodiment of the present disclosure.

FIG. 3 is a block diagram showing a typical functional configuration of the embodiment of the present disclosure. As shown in the figure, it is assumed that the logic evaluation section 340 has the function of a mask generating block 341 whereas the memory array 310 has the functions of a bit operating block 315, a memory cell 316 and a read processing block 317. In addition, it is assumed that the control section 350 has the function of a pre-processing-execution determining block 351.

Figure 4A:
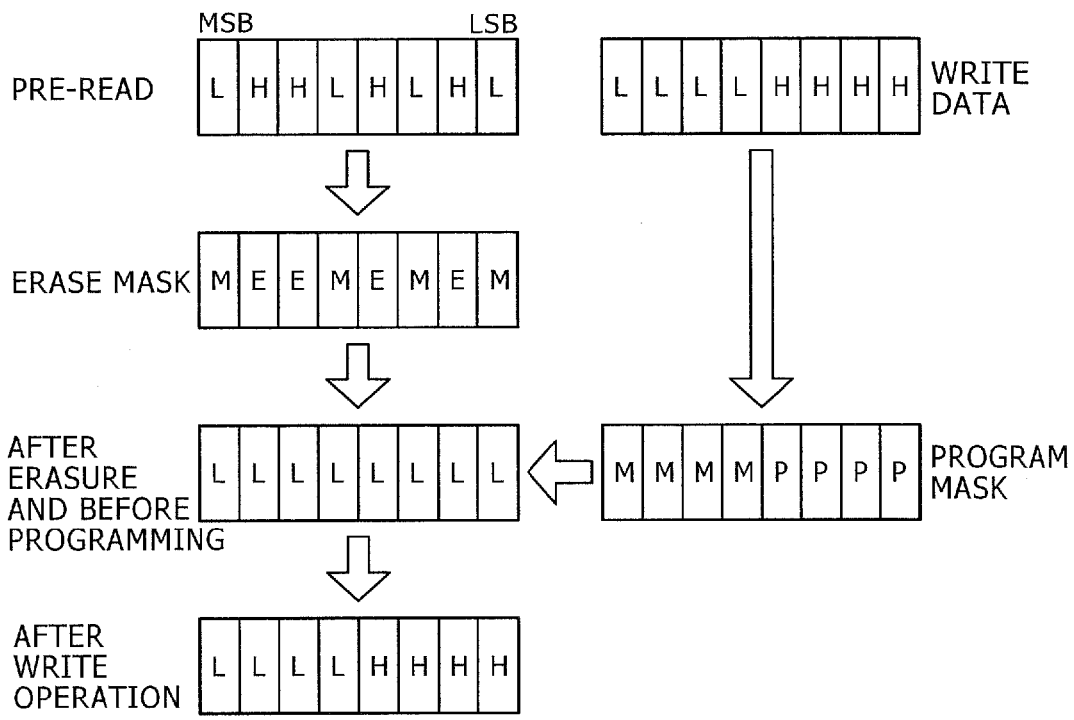
FIGS. 4A and 4B are diagrams to be referred to in description of typical concrete write operations carried out on a variable-resistance device in accordance with a first embodiment of the present disclosure.

The mask generating block 341 is a section for generating an erase mask and a program mask from pre-read data stored in the read buffer 330 and/or data to be written (also referred to as "write data" hereunder where appropriate) stored in the write buffer 320. As shown in FIG. 4A, the erase mask is a mask for resetting the pre-read data. The erase mask is a mask having each bit thereof corresponding to one of the bits of the pre-read data. If the bit of the pre-read data is an H-level bit, the corresponding bit in the erase mask is set to change (or erase) the bit of the pre-read data from the H level to an L level. If the bit of the pre-read data is an L-level bit, on the other hand, the corresponding bit in the erase mask is set to keep (or mask) the bit of the pre-read data at the L level as it is.

Also as shown in FIG. 4A, on the other hand, the program mask is a mask for programming the reset pre-read data also referred to hereafter as erase-masked data into the write data. The program mask is a mask having each bit thereof corresponding to one of the bits of the write data. If the bit of the write data is an H-level bit, the corresponding bit in the program mask is set to change (or program) the bit of the pre-read data reset by the erase mask from an L level to the H level. If the bit of the write data is an L-level bit, on the other hand, the corresponding bit in the program mask is set to keep (or mask) the bit of the pre-read data reset by the erase mask at the L level as it is.

The bit operating block 315 is a section for erasing or programming bits in a data area at a write address in the memory cell 316 in accordance with the erase or program mask generated by the mask generating block 341. To be more specific, if the bit operating block 315 receives an erase mask, the bit operating block 315 erases only bits each corresponding to an erase bit of the erase mask to the L level. The bit operating block 315 does not change the other bits each corresponding to a mask bit of the erase mask. If the bit operating block 315 receives a program mask, on the other hand, the bit operating block 315 merely programs only bits each corresponding a program bit of the program mask to the H level. The bit operating block 315 does not change the other bits each corresponding to a mask bit of the program mask.

The read processing block 317 is a section for reading out data from a data area at a write address in the memory cell 316 prior to a write operation if necessary. The data read out prior to a write operation in this way is stored in the read buffer 330 as the pre-read data cited before. It is to be noted that the read processing block 317 is a typical pre-read processing block described in claims of this specification.

The pre-processing-execution determining block 351 is a section for determining whether or not pre-processing is to be executed in a write operation. The pre-processing-execution determining block 351 determines whether or not pre-processing is to be executed on the basis of a control signal received from the control interface 309 through the signal line 307.

If necessary, the control section 350 properly repeats processing in the typical functional configuration described above. As will be described later, in this embodiment, if necessary, the read processing block 317 carries out a pre-read operation in order to generate each of the erase mask and the program mask. In addition, the bit operating block 315 carries out erase and program operations. If the pre-processing-execution determining block 351 determines that pre-processing is to be omitted, however, the pre-read and erase operations for the pre-processing are not carried out.

[Typical Write Operations]

Figure 4B:
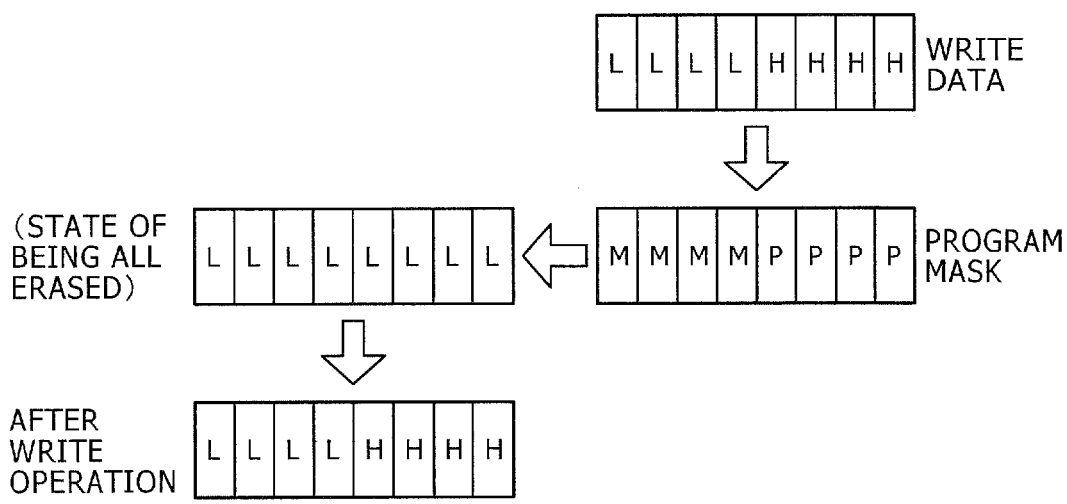

FIGS. 4A and 4B are diagrams referred to in the following description of typical concrete write operations carried out on a variable-resistance device in accordance with a first embodiment of the present disclosure. In each of these typical write operations, it is assumed that write data of 'LLLLHHHH' is written into a data area in which pre-read data of 'LHHLHLHL' has been stored. In this first embodiment, if necessary, prior to the write operation, the pre-read data of 'LHHLHLHL' is read out from the data area. Then, pre-processing is carried out in the write operation in accordance with a command received from the control interface 309. In addition, in this first embodiment, as the pre-processing, all the bits of the data area serving as the object of the write operation are reset at the L level by resetting the pre-read data of 'LHHLHLHL.'

FIG. 4A shows typical operations carried out in the write operation for a case in which the pre-processing is performed. The mask generating block 341 generates an erase mask for preventing L bits of the pre-read data of 'LHHLHLHL' from being wastefully erased to the L level. That is to say, the mask generating block 341 generates an erase mask of 'MEEMEMEM' for erasing only each of H bits of the pre-read data to the L level. An E bit in the erase mask is a bit for erasing the corresponding H bit of the pre-read data to the L level whereas an M bit in the erase mask is a bit for preventing the corresponding L bit of the pre-read data from being wastefully erased to the L level. The bit operating block 315 makes use of this erase mask to reset all bits in the pre-read data in the write operation for the data area serving as the object of the write operation to the L level. That is to say, the bit operating block 315 applies the erase mask to the pre-read data in order to generate erase-masked data of 'LLLLLLLL.'

For the write data of 'LLLLHHHH,' the mask generating block 341 generates a program mask for programming only each specific bit of the erase-masked data to the H level. A specific bit of the erase-masked data is a bit corresponding to the H bit of the write data. That is to say, the mask generating block 341 generates a program mask of 'MMMMPPPP' for writing H-level information into only each of the specific bits of the erase-masked data. A P bit in the program mask is a bit for setting a corresponding bit in the erase-masked data to the H level whereas an M bit in the program mask is a bit for keeping a corresponding bit in the erase-masked data at the L level as it is. The bit operating block 315 applies the program mask to the erase-masked data in order to store the write data of 'LLLLHHHH' into the data area serving as the object of the write operation.

FIG. 4B shows typical operations carried out in the write operation for a case in which the pre-processing is not performed. For example, the operations are carried out if it is known that data of 'LLLLLLLL' has been stored in the data area serving as the object of the write operation. In such a case, the pre-read operation and the operation to generate an erase mask are not carried out. Much like the case shown in FIG. 4A, however, the mask generating block 341 generates a program mask of 'MMMMPPPP.' The bit operating block 315 applies the program mask to data with all bits thereof reset in order to store the write data of 'LLLLHHHH' into the data area serving as the object of the write operation.

[Pre-Processing Execution Determination]

Next, the following description explains a procedure adopted by the pre-processing-execution determining block 351 according to the embodiment to determine whether or not the pre-processing is to be omitted. It is assumed that, in this embodiment, the control interface 309 gives a command to the pre-processing-execution determining block 351 through the signal line 307 to omit the pre-processing. Such a command to omit the pre-processing is issued conceivably because, for example, it is known that the non-volatile memory has been entirely put in an erased state at a factory before the non-volatile memory or the storage system making use of the memory is shipped from the factory.

The pre-processing-execution determining block 351 has an internal control register for holding information indicating whether or not the omission of the pre-processing has been requested. If the information indicates that the omission of the pre-processing has been requested, the pre-processing is not carried out in the write operation. The control register can be implemented by a NOR memory which is used widely. In addition, a control bit for controlling execution and the omission of the pre-processing may also be included in an overlay-window control register such as an LPDDR-NVM conforming to a JEDEC standard. On top of that, as will be described below, it is also possible to make use of an instruction given by the host computer 100.

Figure 5A:
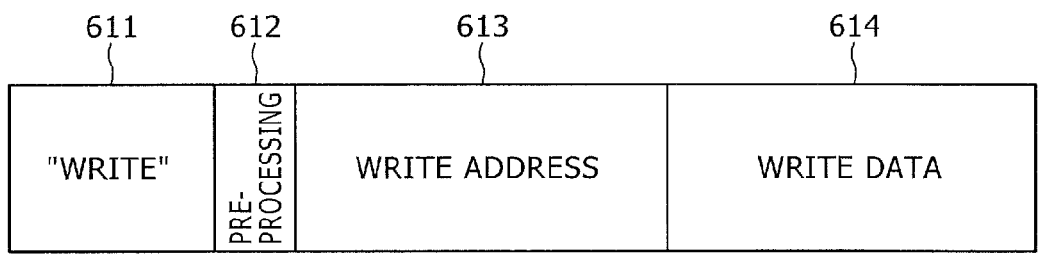
FIGS. 5A to 5C are diagrams showing typical commands requesting execution and omission of pre-processing in the first embodiment of the present disclosure.
Figure 5B:
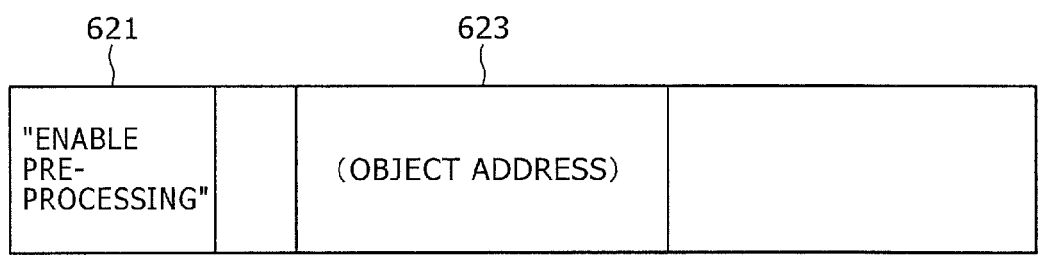
Figure 5C:
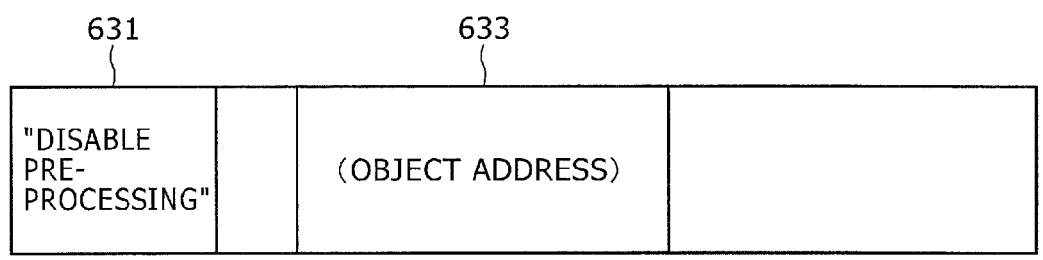

FIGS. 5A to 5C are diagrams showing typical commands requesting execution and omission of pre-processing in the first embodiment of the present disclosure.

FIG. 5A shows a typical write command including a field used for holding a pre-processing flag 612 indicating whether the pre-processing is to be executed or omitted. An operation code 611 indicates that this command is a write command. Operands of the write command include a write address 613 and write data 614. As described above, the pre-processing flag 612 indicates whether the pre-processing is to be executed or omitted. If the pre-processing flag 612 indicates that the pre-processing is to be executed for example, the pre-processing is carried out in the write operation. If the pre-processing flag 612 indicates that the pre-processing is to be omitted, on the other hand, the pre-processing is not carried out in the write operation.

On the other hand, an independent command can be used to indicate whether the pre-processing is to be executed or omitted. FIG. 5B shows a typical configuration of a pre-processing enable command including a field showing that the pre-processing is to be carried out. An operation code 621 in the field indicates that this command is a pre-processing enable command. It is to be noted that the pre-processing enable command may include an operand for specifying an object address 623 for which the pre-processing is to be carried out.

On the other hand, FIG. 5C shows a typical configuration of a pre-processing disable command including a field showing that the pre-processing is to be omitted. An operation code 631 in the field indicates that this command is a pre-processing disable command. It is to be noted that the pre-processing disable command may include an operand for specifying an object address 633 for which the pre-processing is to be omitted.

[Operations of the Information Processing System]

Figure 6:
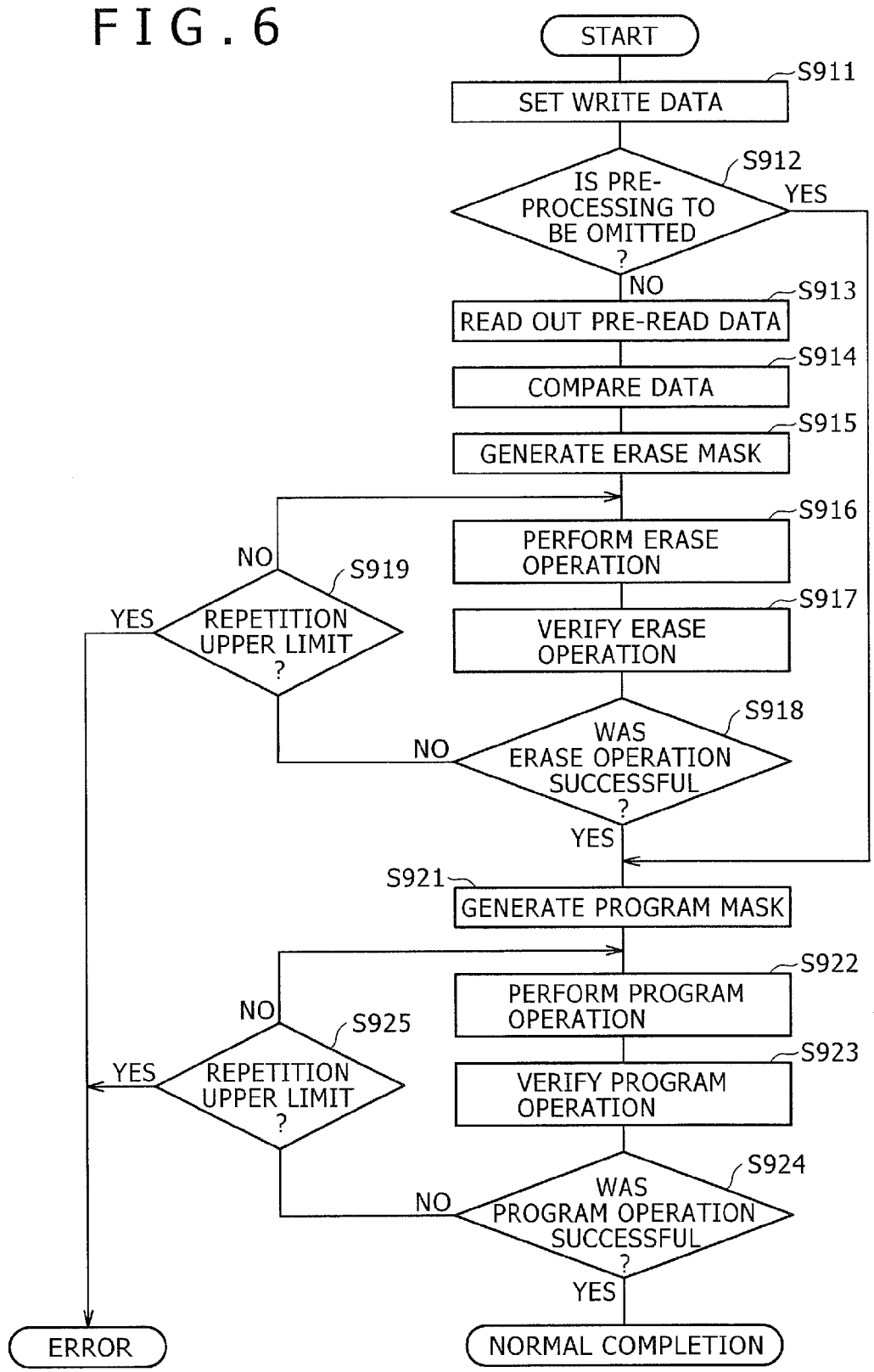
FIG. 6 is a flowchart representing a typical write-operation procedure adopted in an information processing system according to an embodiment of the present disclosure.

FIG. 6 is a flowchart representing a typical write-operation procedure adopted in an information processing system according to an embodiment of the present disclosure. First of all, at a step S911 of the flowchart, when write data and a write command are issued to the NVRAM 301, the write data is stored in the write buffer 320. Then, at the next step S912, the pre-processing-execution determining block 351 determines whether or not pre-processing is to be carried out on a data area serving as the object of the write operation requested by the write command. If the result of the determination performed at the step S912 is No indicating that the pre-processing is to be carried out, steps S913 to S919 are executed. If the result of the determination performed at the step S912 is Yes indicating that the pre-processing is not to be carried out, on the other hand, the steps S913 to S919 are skipped. Instead, operations of a step S921 and subsequent steps are carried out after the step S912.

The pre-processing begins with the step S913 at which a pre-read operation is carried out to read out data 311 and an ECC 312 from the memory cell 316. The pre-read operation is carried out by the read processing block 317. The data 311 and the ECC 312 are stored in the read buffer 330 as pre-read data. Then, at the next step S914, the pre-read data is compared with reset data used as a reference. As a result of the comparison, an erase mask is generated by the mask generating block 341 at the next step S915. The erase mask is a mask for preventing L bits of the pre-read data from being wastefully erased to the L level. Then, at the next step S916, an erase operation is carried out on the data 311 and the ECC 312 in accordance with the erase mask. Subsequently, at the next step S917, a verify operation is carried out to verify the erase operation. Then, at the next step S918, the result of the verify operation is examined in order to determine whether or not the erase operation has been carried out successfully. If the result at the step S918 is No indicating that the erase operation has not been carried out successfully, the flow of the write-operation procedure goes on to a step S919 in order to determine whether or not the erase operation and the verify operation have been carried out a predetermined number of times. If the result at the step S919 is No indicating that the erase operation and the verify operation have not been carried out the predetermined number of times, the flow of the write-operation procedure goes back to the step S916 in order to repeat the erase operation and the verify operation. If necessary, the erase operation and the verify operation are carried out repeatedly till the result at the step S918 becomes Yes indicating that the erase operation has been carried out successfully or the result at the step S919 becomes Yes indicating that the erase operation and the verify operation have been carried out the predetermined number of times. As the result at the step S919 becomes Yes, the existence of a bad memory cell or a bad page is determined. In this case, the write-operation procedure is terminated by indicating detection of an error caused by the bad memory cell or the bad page.

If the erase operation has been carried out successfully or if the pre-processing is to be omitted, the flow of the write-operation procedure goes on to a step S921 at which the mask generating block 341 generates a program mask for programming the pre-read data reset in the erase operation as described above into the write data. If the bit of the write data is an H-level bit, the corresponding bit in the program mask is set to change (or program) the bit of the pre-read data from an L level to the H level. Then, at the next step S922, a program operation is carried out on the data 311 in accordance with the program mask. Subsequently, at the next step S923, a verify operation is carried out to verify the program operation. Then, at the next step S924, the result of the verify operation is examined in order to determine whether or not the program operation has been carried out successfully. If the result of the examination carried out at the step S924 is No indicating that the program operation has not been carried out successfully, the flow of the write-operation procedure goes on to a step S925 in order to determine whether or not the program operation and the verify operation have been carried out a predetermined number of times. If the result of the determination carried out at the step S925 is No indicating that the program operation and the verify operation have not been carried out the predetermined number of times, the flow of the write-operation procedure goes back to the step S922 in order to repeat the program operation and the verify operation. If necessary, the program operation and the verify operation are carried out repeatedly till the result of the examination carried out at the step S924 becomes Yes indicating that the program operation has been carried out successfully or the result of the determination carried out at the step S925 becomes Yes indicating that the program operation and the verify operation have been carried out the predetermined number of times. As the result of the determination carried out at the step S925 becomes Yes, the existence of a bad memory cell or a bad page is determined. In this case, the write-operation procedure is terminated by indicating detection of an error caused by the bad memory cell or the bad page. If the result of the examination carried out at the step S924 is Yes indicating that the program operation has been carried out successfully, the write-operation procedure is ended normally.

That is to say, if all the bits of the data area serving as the object of the write operation are found out in the write operation to have been erased to the L level, the flow of the write-operation procedure jumps from the step S912 to the step S921, skipping the steps S913 to S919. The operations of the step S921 and the subsequent steps are carried out by making use the program mask according to the write data on the assumption that all the bits of the data area serving as the object of the write operation are found out to have been erased to the L level. Thus, it is possible to eliminate the time consumed to carry out the operation to read out pre-read data and the erase operation. As a result, the write operation can be carried out in a short period of time.

As described above, in accordance with the first embodiment of the present disclosure, if a command received from the control interface 309 indicates that the pre-processing is to be omitted, the pre-processing is not carried out so that the write operation can be carried out in a short period of time.

In many cases, customer data has been stored in advance in a non-volatile memory at a factory before the non-volatile memory or a storage system making use of the memory is shipped from the factory. The shorter the time it takes to carry out a write operation, the higher the level to which the availability factor of an apparatus used for carrying out the write operation can be raised and, thus, the lower the cost to operate the apparatus. That is to say, there is a strong economical need for a short time it takes to carry out a write operation. For example, data such as an operating system and applications has been stored in advance in an SSD (Solid State Drive) employed in a personal computer or a non-volatile memory employed in a tablet computer at a factory when the SSD and the non-volatile memory are shipped from the factory. In some cases, a component vendor supplying a non-volatile memory apparatus such as an SSD or an eMMC is requested to supply the non-volatile memory apparatus and a non-volatile memory component with such data already stored in the non-volatile memory apparatus and the non-volatile memory component in advance at the stage of producing the non-volatile memory apparatus and the non-volatile memory component. In many of such cases, it is found out that the memory has been entirely put in an erased state at the factory. Thus, this embodiment can be applied to such a memory.

[Typical Modification]

In the embodiment described above, the pre-processing is assumed to be processing to erase all bits of a data area serving as the object to the write operation by resetting all the bits to the L level. However, the scope of the present disclosure is by no means limited to such an embodiment. As will be described below, on the other hand, the pre-processing can also be processing to program all bits of a data area serving as the object of the write operation by setting all the bits to the H level.

Figure 7:
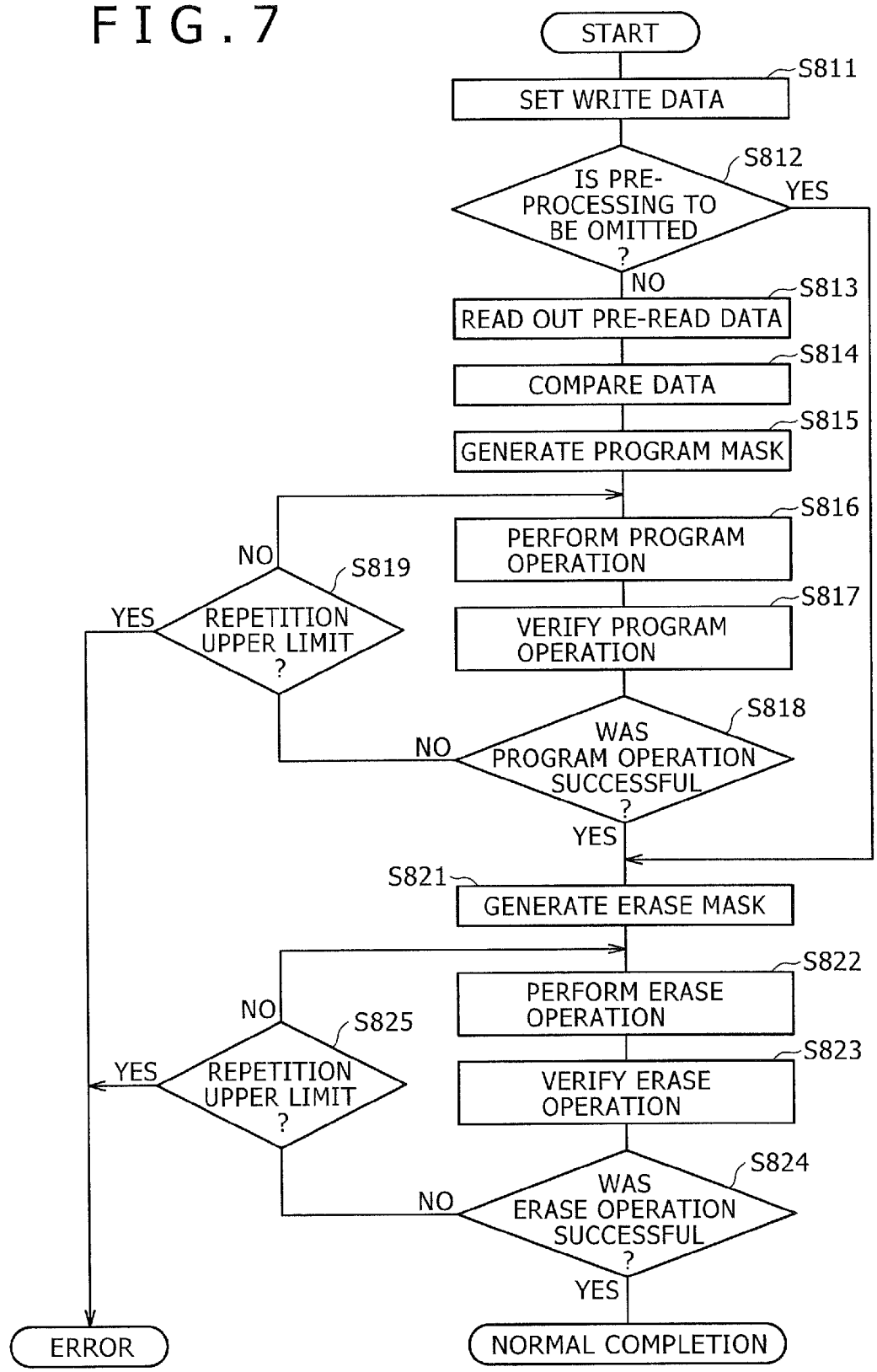
FIG. 7 is a flowchart representing a typical modified write-operation procedure adopted in an information processing system according to an embodiment of the present disclosure.

FIG. 7 is a flowchart representing a typical modified write-operation procedure adopted in an information processing system according to an embodiment of the present disclosure. In the case of this typical modified write-operation procedure, the pre-processing is assumed to be processing to program all bits of a data area serving as the object to the write operation by setting all the bits to the H level. At a step S813 of the flowchart shown in the figure, a pre-read operation is carried out to read out data from the memory cell 316. Then, a program mask is generated by the mask generating block 341 at a step S815.

If all bits of a data area serving as the object of the write operation are found out in the write operation to have been programmed in advance to the H level, the procedure of the write operation jumps from a step S812 to a step S821, skipping steps S813 to S819. Operations of the step S821 and subsequent steps are carried out to erase some bits in the data area serving as the object of the write operation in accordance with the data to be written by assuming that all the bits of the data area have been programmed to the H level. Thus, it is possible to eliminate the time consumed to carry out the operation to read out pre-read data and the program operation. As a result, the write operation can be carried out in a short period of time.

2. Second Embodiment

An operation to write data into a non-volatile memory apparatus such as an SSD or an eMMC is carried out through a file system. In an operation to erase data from a sector or a page, normally, a 'Not in Use' flag is set for the erased sector or the erased page. That is to say, data is not actually erased from the sector or the page. Thus, in a storage system such as an SSD, data including the 'Not in Use' flag is handled uniformly and independently of the 'Used' and 'Not in Use' states utilized in the file system. In consequence, inside the storage system, internal processing such as garbage collection is carried out also on a 'Not in Use' sector (or a 'Not in Use' page) which is not used from the beginning. Thus, it has been pointed out that the execution of such internal processing on a 'Not in Use' sector or a 'Not in Use' page causes the performance of the storage system to degrade. The performance of the storage system degrades, for example, because the number of information alterations accompanying unnecessary data movements increases and the life of the memory cell becomes shorter due to such an increasing information-alteration count. In making an approach to this problem, as a part of ATA8 ACS2 specifications prepared by a T13 technology committee of the INCITS (International Committee for Information Technology Standards), a Trim command has been proposed and implemented. The Trim command is a command for notifying the storage system of a 'Not in Use' sector in order to improve the internal performance of the storage system. However, the specifications merely define the Trim command which can be implemented by adoption of a method having a variety of forms. In a storage system such as an SSD making use of a NAND flash memory for example, various kinds of implementation means described below can be adopted:

(1) Nothing is carried out even if a Trim command is received.
(2) The garbage collection is not carried out for data at the relevant address.
(3) Data at the relevant address is erased each time a Trim command is received.
(4) A mark is merely attached to the relevant address as preparation for a write operation carried out in the future on the address and, in a background operation, the data at the marked address is actually erased with a timing of no access made as an access to this address.

As another movement toward standardization, by the same token, a T10 technology committee of the INCITS has also proposed a Trim command in the SCSI protocol and included the command in specifications. In addition, by the same token, the JEDEC (Joint Electron Device Engineering Council) has also proposed a Trim command for the eMMC and included the command in specifications.

The NVRAM (Non-Volatile Random Access Memory) is a RAM which allows random accesses to be made thereto and is used as a non-volatile memory. Unlike the NAND-type flash memory, in the NVRAM, an erase operation is not carried out for a block unit and an overwrite operation can be performed. In many cases, the NAND-type flash memory is utilized in an SSD which is widely used at present and employs typically a SATA I/F. In general, for example, a PC connected to such a NAND SSD also executes control taking the NAND SSD into consideration. The Trim command itself is also prescribed in specifications suppressing a write amplification factor in an erase operation carried out on a block unit generated as a NAND characteristic. That is to say, from the compatibility point of view, it is not possible to expect that control from a host system connected to the SSD toward the NVRAM (Non-Volatile Random Access Memory) is always carried out. The write amplification factor cited above is a ratio of an SSD internal write quantity to a write quantity specified by an OS. The higher the write amplification factor, the lower the efficiency of the memory access.

As an approach to this problem, in the case of a storage system employing a non-volatile random-access memory making use of a variable-resistance device, an operation corresponding to an erase operation for a NAND-type flash memory is conceivably carried out by writing data of all 0 into the non-volatile random-access memory. In accordance with the conventional technology, however, in a next write operation carried out on an already erased sector or an already erased page, there is undesirably raised a new problem that a pre-read operation must be carried out in order to examine an already written state in spite of the fact that the already written state is an already erased state which is a known state.

As described above, in the case of this embodiment of the present disclosure, if the state of a data area serving as the object of the write operation is known in a write operation, the pre-processing to read out pre-read data from the data area can be omitted. In the second embodiment, if a Trim command has been issued for a data area serving as the object of the write operation, the pre-processing is omitted and only a program operation is carried out provided that an operation to erase the data area has been completed. It is to be noted that the configuration of the information processing system according to the second embodiment and the functions of the system are identical with those of the first embodiment described earlier so that the configuration and the functions are not explained again in the following description.

FIG. 8 is a diagram showing a typical management information table used in this embodiment of the present disclosure. It is assumed that the management information table is a table included in the embedded memory 220 and used for storing management information. If the embedded memory 220 is a volatile memory, in order to prevent the management information from being lost due to a failure of the power supply, the management information is saved at time intervals determined in advance in a non-volatile memory such as the flash memory 302. The management information table is used for storing a logical address 221, a physical address 222, a Trim flag 223 and an erase flag 224 for each data area as shown in the figure.

The logical address 221 is a logical address assigned by the host computer 100 to the data area. The physical address 222 is an address corresponding to the logical address 221 and identifying a storage area included in the NVRAM 301 as the data area. When the logical address 221 is specified by the host computer 100, the logical address 221 is converted into the physical address 222 by carrying out an address conversion process based on a relation between logical addresses and physical addresses.

The Trim flag 223 is information indicating whether or not a Trim command has been issued for a data area corresponding to the logical address 221 and the physical address 222. As described above, the Trim command is a command for notifying the storage system of a 'Not in Use' data area. Thus, a data area having a set Trim flag 223 is an area that is not used as a valid area.

The erase flag 224 is information indicating whether or not an erase operation has already been carried out on a data area corresponding to the logical address 221 and the physical address 222. Thus, a set erase flag 224 indicates that all bits of the data area have already been erased to a reset state.

[Operations of the Information Processing System]

The information processing system according to the second embodiment carries out the same operations as the operations which are explained earlier by referring to the flowchart shown in FIG. 6 as the operations carried out by the information processing system according to the first embodiment. In the case of the second embodiment, in the process carried out at the step S912 of the flowchart shown in FIG. 6 to determine whether or not the pre-processing is to be executed, the erase flag 224 is referred to. If the erase flag 224 indicates that an erase operation has been carried out, the pre-processing is omitted by jumping to the step S921. As described above, a set erase flag 224 indicates that all bits of the data area have already been erased to a reset state in an erase operation carried out after the issuance of a Trim command. Thus, by referring to the erase flag 224, it is possible to recognize the write state of the data area.

Figure 9:
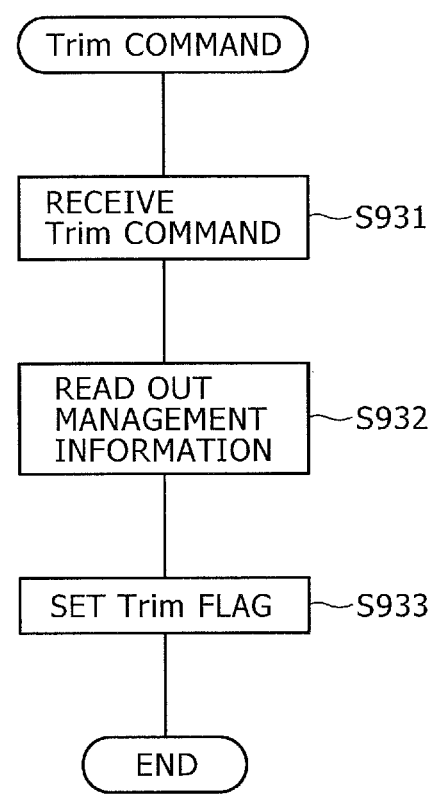
FIG. 9 is a flowchart representing a typical processing procedure adopted in a memory system as a procedure for carrying out a received Trim command in accordance with a second embodiment of the present disclosure.

FIG. 9 is a flowchart representing a typical processing procedure adopted in the memory system 400 as a procedure for carrying out a received Trim command in accordance with the second embodiment of the present disclosure. As shown in the figure, the flowchart begins with a step S931 at which the memory system 400 receives the Trim command. Then, at the next step S932, the processor 210 reads out management information from the management information table stored in the embedded memory 220. As an alternative, the management information table can also be stored in the volatile memory 303 to be used on an as-demanded basis. As another alternative, the management information table can also be saved in advance in the NVRAM 301 or the flash memory 302 as preparation for a failure of the power supply.

Then, at the next step S933, the processor 210 carries out an address conversion process of converting a logical address 221 into a physical address 222 by making use of the management information to specify the physical address, and sets the Trim flag 223 for the physical address 222. That is to say, the processor 210 sets the Trim flag 223 to a value indicating that the Trim command has been received. After the Trim flag 223 has been set for all logical addresses specified by the Trim command, the processing represented by the flowchart is ended. At this point of time, a physical erase operation is not carried out for a physical address, the Trim flag of which has been set. Later on, the physical erase operation is carried out in advance for a physical address with a set Trim flag as background processing in an idle state in which no access is made to the memory system 400.

Figure 10:
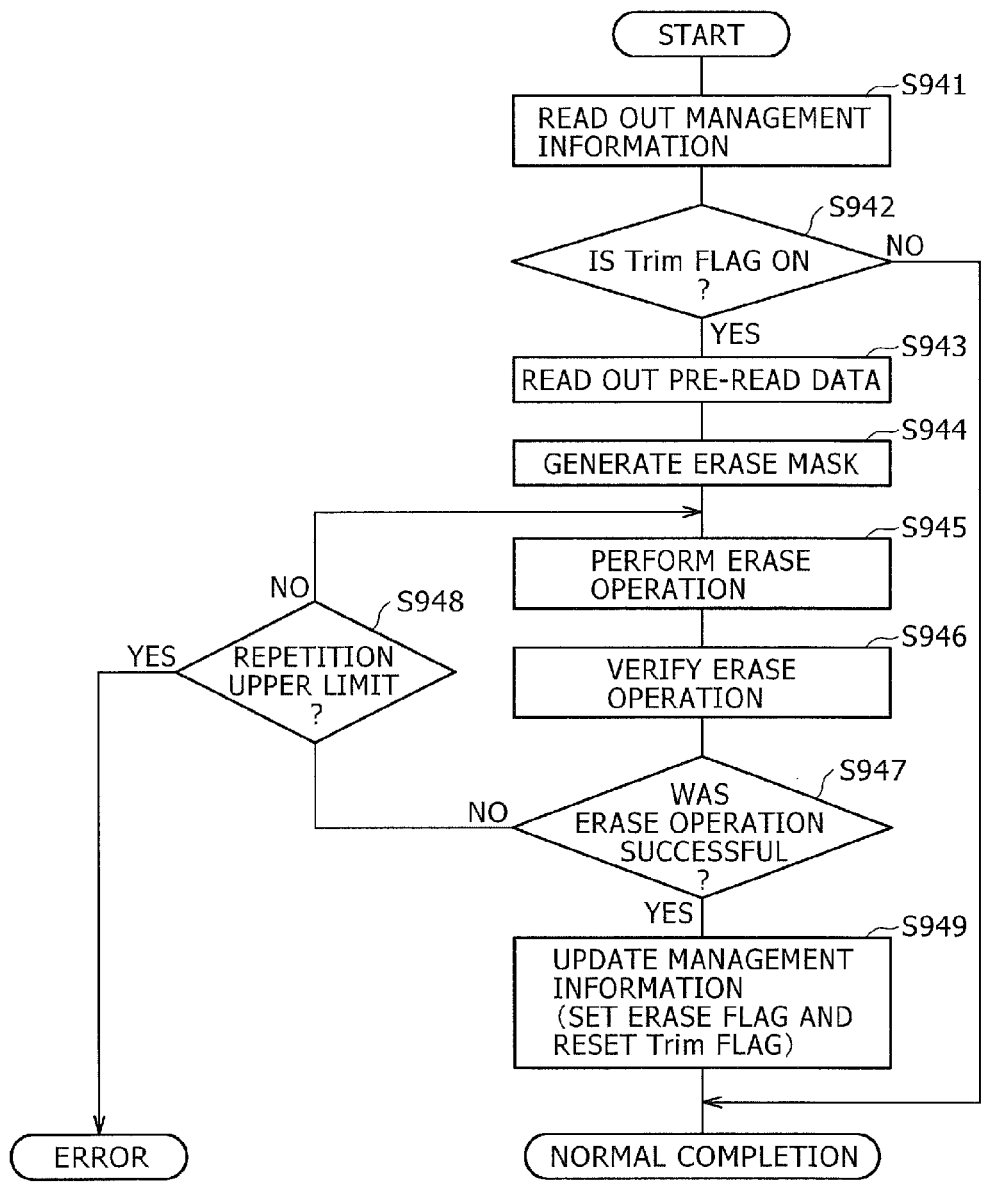
FIG. 10 is a flowchart representing a typical processing procedure adopted in the memory system as the procedure of an erase operation carried out in advance as a background process in accordance with the second embodiment of the present disclosure.

FIG. 10 is a flowchart representing a typical processing procedure adopted in the memory system 400 as the procedure of an erase operation carried out in advance as a background process in accordance with the second embodiment of the present disclosure. As shown in the figure, the flowchart begins with a step S941 at which the processor 210 reads out management information when the memory system 400 enters an idle state allowing an erase operation to be carried out in advance as a background process. Then, at the next step S942, the management information is searched for a physical address with a set Trim flag 223. If such a physical address is not found, the execution of the procedure is ended. If such a physical address is found, on the other hand, the flow of the procedure goes on to a step S943 at which data already stored on a page indicated by the physical address is read out from the page in order to avoid wasteful and excessive erasure. Then, at the next step S944, an erase mask is created to serve as a mask for erasing particular bits of the data. The particular bits of the data are bits that need to be erased in order to reset the data. Then, at the next step S945, in accordance with the erase mask, an erase operation is carried out to reset the data which includes data 311 and an ECC 312. Subsequently, at the next step S946, a verify operation is carried out to verify the erase operation. Then, at the next step S947, the result of the verify operation is examined in order to determine whether or not the erase operation has been carried out successfully. If the result of the examination carried out at the step S947 is No indicating that the erase operation has not been carried out successfully, the flow of the procedure goes on to a step S948 in order to determine whether or not the erase operation and the verify operation have been carried out a predetermined number of times. If the result of the determination carried out at the step S948 is No indicating that the erase operation and the verify operation have not been carried out the predetermined number of times, the flow of the procedure goes back to the step S945 in order to repeat the erase operation and the verify operation. If necessary, the erase operation and the verify operation are carried out repeatedly till the result at the step S947 becomes Yes indicating that the erase operation has been carried out successfully or the result at the step S948 becomes Yes indicating that the erase operation and the verify operation have been carried out the predetermined number of times. As the result of the determination carried out at the step S948 becomes Yes, the existence of a bad memory cell or a bad page is determined. In this case, the write-operation procedure is terminated by indicating detection of an error caused by the bad memory cell or the bad page.

If the result of the examination carried out at the step S947 is Yes indicating that the erase operation has been carried out successfully without creating a problem, on the other hand, the flow of the procedure goes on to a step S949 at which the Trim flag 223 of the management information is reset and the erase flag 224 of the management information is set in order to indicate that the erase operation has been completed. Then, the execution of this procedure is ended.

If the Trim flag 223 has been set for each of a plurality of pages, the processing described above is carried out for each of the pages. If the time consumed to carry out the processing for the pages seems to become too long, the processing can be split into portions performed at different times. For example, when a command is received from the host system while the processing is being carried out repeatedly, the repetition of the processing can be suspended. Since an overwrite operation can be carried out on an NVRAM as described above, no mismatching is generated even if an overwrite operation is performed on a page with a set Trim flag 223 and an unset erase flag 224.

Since the write state of a page already erased by an erase operation carried out as background processing is known, the write operation can be carried out by jumping from the step S912 to the step S921 in the flowchart shown in FIG. 6 if the erase flag 224 of the management information indicates an already erased state in the write operation. Since background processing is invisible if seen from the host computer 100 connected to the memory system 400, the write operation appears to the host computer 100 as an operation which can be carried out in a short period of time. If a page cannot be erased in advance in the background processing, for the page, the write operation is carried out by continuing the operation from the step S912 to the step S913. In this case, as operations carried out by the memory system 400, it is only necessary to add an operation to reset the Trim flag 223 of the management information. This added operation is an operation to be carried out after completion of the write operation represented by the flowchart shown in FIG. 6. If it is assumed that the erase flag 224 is set for all physical addresses accessed in a pattern of accesses made by the host computer 100 at a level higher then the memory system 400, the average speed of the write operations is improved from a pre-improvement value to a value which is approximately twice the pre-improvement value.

As described above, in accordance with the second embodiment of the present disclosure, if the erase operation is completed later on after a Trim command has been received, the pre-processing is omitted. Thus, the write operation can be carried out in a short period of time.

[Typical Modification]

In the case of the second embodiment described above, it is assumed that all bits of a page at a physical address with a set Trim flag 223 are erased in background processing. However, the scope of the present disclosure is by no means limited to the second embodiment. For example, it is possible to assume a configuration in which all bits of a page at a physical address with a set Trim flag 223 are programmed in advance in background processing and, then, when a write operation is requested for the page later on, only necessary bits of the page are erased.

3. Third Embodiment

In recent years, in video applications, the number of pixels is raised to accompany the increased size of the imaging device. Accompanying the raised number of pixels, a non-volatile memory apparatus such as the SSD allowing a write operation to be carried out in a short period of time is widely used as a storage device for video recording. A sequential write operation is a basic operation for write operations carried out on the non-volatile memory apparatus in these video applications. That is to say, basically, an overwrite operation is not carried out. If all storage areas of the non-volatile memory apparatus have already been put in an erased state which is a known state, the embodiment described above can be applied to the non-volatile memory apparatus. In this case, in order to erase the NVRAM in advance, for example, a Secure Erase command standardized by the T13 technology of the INCITS can be used before video recording.

In addition, in an SSD having a SATA I/F and making use of a NAND-type flash memory, as a result of repeated execution of a write operation, internal processing such as garbage collection in the SSD is frequently carried out so that, in some cases, the performance deteriorates considerably. In order to solve this problem, in some applications, the Secure Erase command is used in order to initialize the SSD so that the frequency of the execution of the internal processing such as garbage collection can be lowered. Thus, in some cases, the technique of making use of the Secure Erase command is adopted in order to obtain benefits resulting from the write operation which can be carried out in a short period of time.

As described above, the Secure Erase command is defined for the purpose of erasing all user data in an SSD in which an encryption function is not embedded. A third embodiment is provided for explaining a typical application of making use of the Secure Erase command. It is to be noted that, since the configuration of the information processing system according to the third embodiment and the functions of the system are identical with those of the first embodiment described earlier, the configuration and the functions are not explained again in the following description. In addition, the third embodiment also includes the management information table shown in FIG. 8 in the same way as the second embodiment.

It is to be noted that, in accordance with a conceivable method for implementing the Secure Erase command in an SSD in which an encryption function is embedded, the encryption key is erased in the SSD and a new encryption key is regenerated therein. In this way, existing data cannot be read out. In the case of the third embodiment, however, this method is not assumed. That is to say, it is assumed that the data area is physically erased.

[Operations of the Information Processing System]

The information processing system according to the third embodiment carries out the same operations as the operations which are explained earlier by referring to the flowchart shown in FIG. 6 as the operations carried out by the information processing system according to the first embodiment. In the case of the third embodiment, in the process carried out at the step S912 of the flowchart shown in FIG. 6 to determine whether or not the pre-processing is to be executed, the erase flag 224 is referred to. If the erase flag 224 indicates that an erase operation has been carried out, the pre-processing is omitted by jumping to the step S921. As described above, a set erase flag 224 indicates that all bits of the data area have already been erased to a reset state in an erase operation carried out after the issuance of a Secure Erase command. Thus, by referring to the erase flag 224, it is possible to recognize the write state of the data area.

Figure 11:
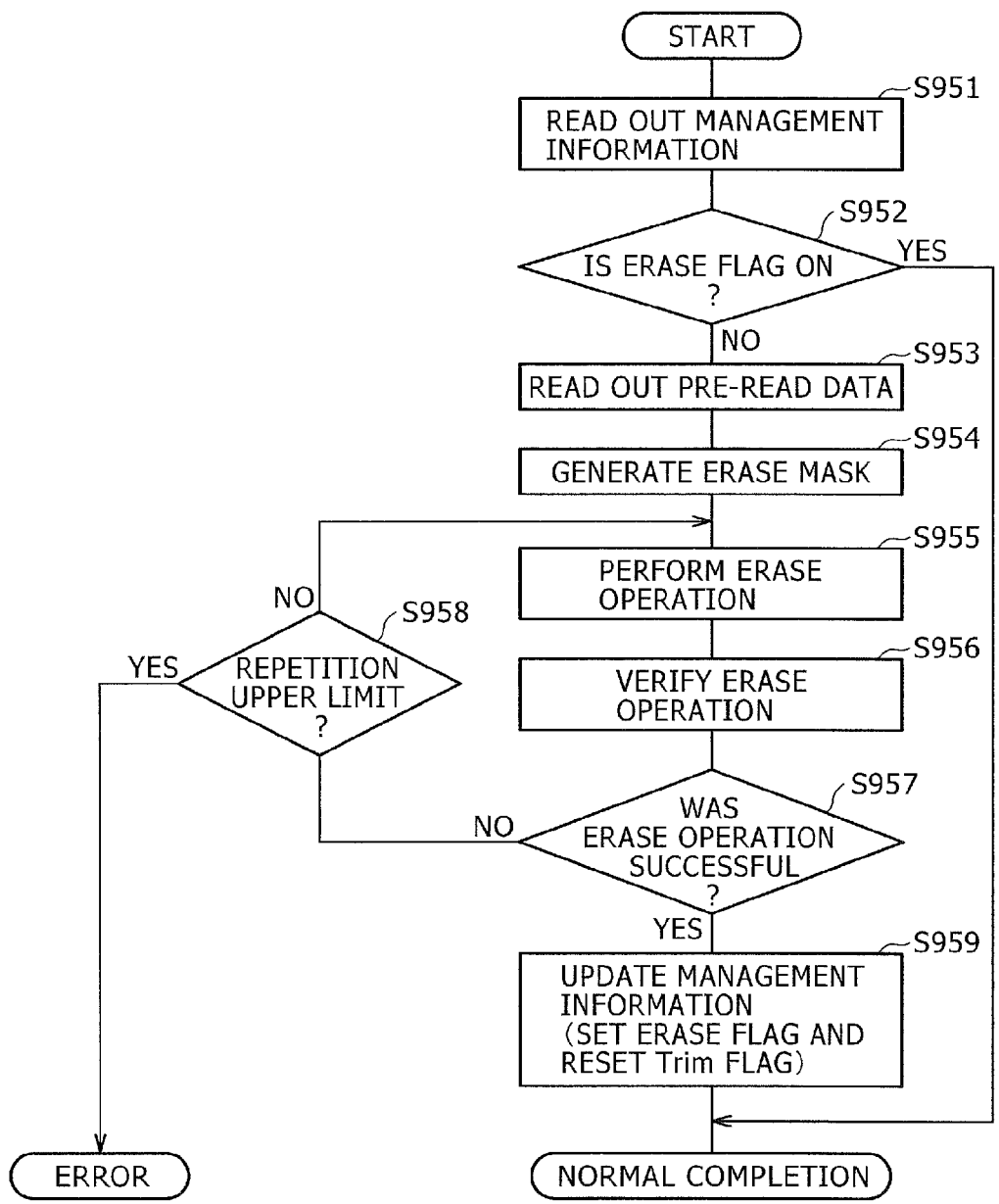
FIG. 11 is a flowchart representing a typical processing procedure adopted in a memory system as a procedure for carrying out a received Secure Erase command in accordance with a third embodiment of the present disclosure.

FIG. 11 is a flowchart representing a typical processing procedure adopted in a memory system 400 as a procedure for carrying out a received Secure Erase command in accordance with the third embodiment of the present disclosure. As shown in the figure, the flowchart begins with a step S951 at which the processor 210 reads out management information when the memory system 400 receives a Secure Erase command. In the case of the second embodiment described earlier, the erase operation is carried out as background processing only on physical addresses for each of which a Trim flag 223 has been set. In the case of the third embodiment, on the other hand, the erase operation is carried out on all physical addresses for each of which the erase flag 224 has not been set to indicate that the erase operation has not been carried out yet. That is to say, at the next step S952, without regard to whether or not the Trim flag 223 has been set, the management information is searched for a physical address for which the erase flag 224 has not been set yet. In other words, all physical addresses, data stored at each of which has not been erased yet, are subjected to the erase operation. It is to be noted that, in the case of the third embodiment, the Secure Erase operation is carried out as foreground processing. Thus, unlike the second embodiment, the time it takes to carry out the Secure Erase operation cannot be concealed.

If a physical address with an erase flag 224 not set yet is not found at the step S952, the execution of the procedure is ended. If a physical address with an erase flag 224 not set yet is found at the step S952, on the other hand, the flow of the procedure goes on to a step S953 at which data already stored on a page indicated by the physical address is read out from the page in order to avoid excessive and wasteful erasure. Then, at the next step S954, an erase mask is created to serve as a mask for erasing particular bits of the data. The particular bits of the data are bits that need to be erased in order to reset the data. Then, at the next step S955, in accordance with the erase mask, an erase operation is carried out to reset the data which includes data 311 and an ECC 312. Subsequently, at the next step S956, a verify operation is carried out to verify the erase operation. Then, at the next step S957, the result of the verify operation is examined in order to determine whether or not the erase operation has been carried out successfully. If the result at the step S957 is No indicating that the erase operation has not been carried out successfully, the flow of the procedure goes on to a step S958 in order to determine whether or not the erase operation and the verify operation have been carried out a predetermined number of times. If the result at the step S958 is No indicating that the erase operation and the verify operation have not been carried out the predetermined number of times, the flow of the procedure goes back to the step S955 in order to repeat the erase operation and the verify operation. If necessary, the erase operation and the verify operation are carried out repeatedly till the result of the examination carried out at the step S957 becomes Yes indicating that the erase operation has been carried out successfully or the result of the determination carried out at the step S958 becomes Yes indicating that the erase operation and the verify operation have been carried out the predetermined number of times. As the result at the step S958 becomes Yes, the existence of a bad memory cell or a bad page is determined. In this case, the write-operation procedure is terminated by indicating detection of an error caused by the bad memory cell or the bad page.

If the result at the step S957 is Yes indicating that the erase operation has been carried out successfully without creating a problem, on the other hand, the flow of the procedure goes on to a step S959 at which the Trim flag 223 of the management information is reset and the erase flag 224 of the management information is set in order to indicate that the erase operation has been completed. Then, the execution of this procedure is ended.

As described above, in the case of the third embodiment, the Secure Erase command can be executed in order to completely erase user data in advance. By completely erasing user data in advance, the completely erased state is known. Thus, the steps of reading out pre-read data and erasing the data can be omitted. In a video application, sequential write operations are a characteristic and, basically, an overwrite operation on data is not carried out. Thus, by combining the write method provided by the present disclosure with the Secure Erase command, the speed of the write operation can be improved from a pre-improvement value to a high value which is approximately twice the pre-improvement value. As a result, a very big effect can be obtained.

4. Fourth Embodiment

In the case of the first embodiment, the pre-processing is carried out in order to set all bits of a data area serving as the object of a write operation to the L (or H) level. In the case of the fourth embodiment, on the other hand, the pre-processing is carried out in order to compare pre-read data with write data and set only specific bits of a data area serving as the object of a write operation to the L (or H) level. A specific bit of a data area is a bit that needs to be set eventually to the L (or H) level. It is to be noted that, since the configuration of the information processing system according to the fourth embodiment and the basic flow of operations carried out by the system are identical with those of the other embodiments described earlier, the configuration and the basic flow of operation are not explained in detail again in the following description.

[Typical Write Operations]

Figure 12A:
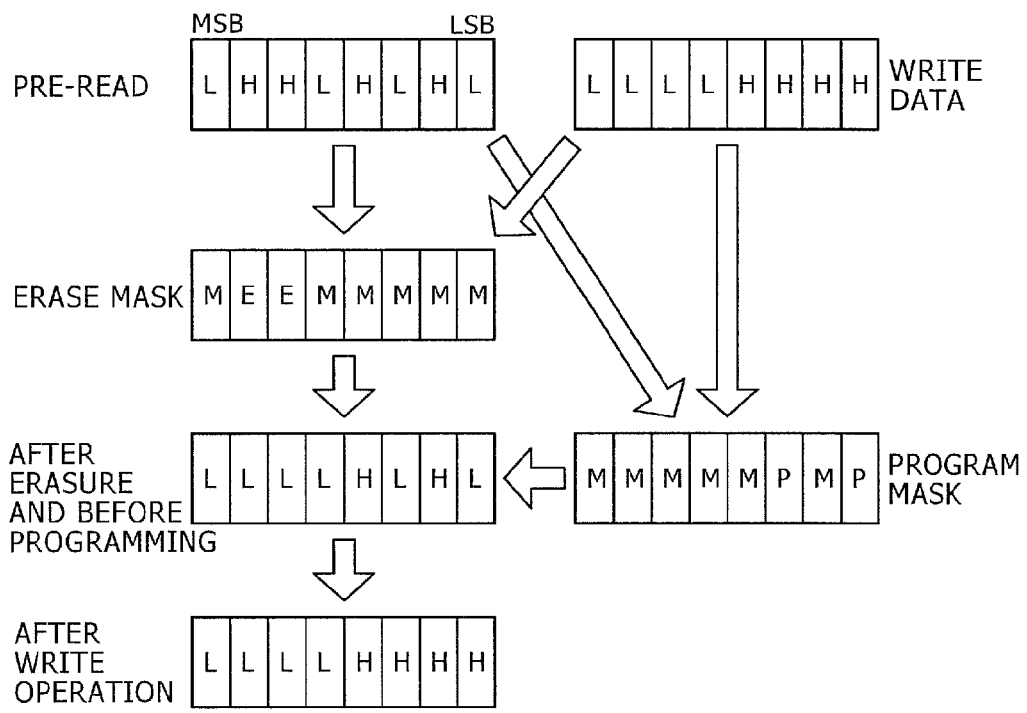
FIGS. 12A and 12B are diagrams to be referred to in description of typical concrete write operations carried out on a variable-resistance device in accordance with a fourth embodiment of the present disclosure.
Figure 12B:
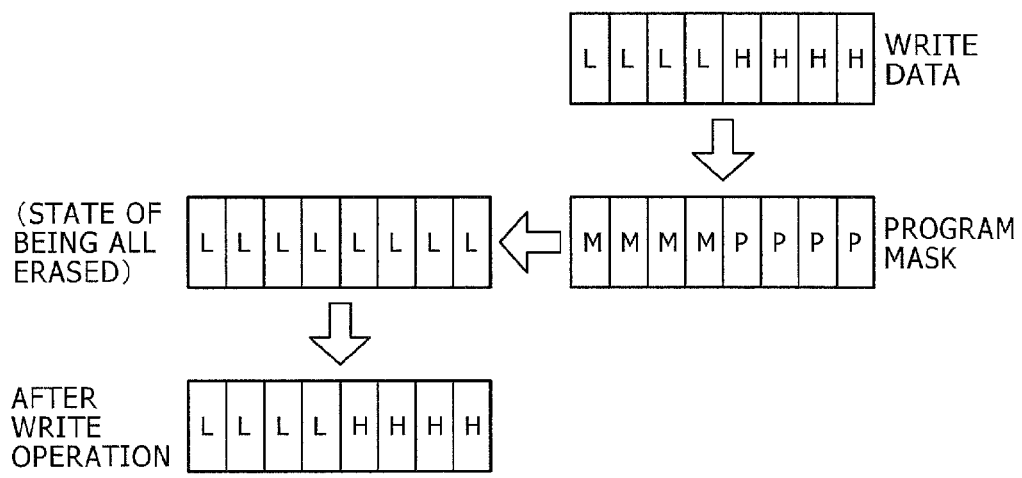

FIGS. 12A and 12B are diagrams referred to in the following description of typical concrete write operations carried out on a variable-resistance device in accordance with the fourth embodiment of the present disclosure. In one of these typical write operations, it is assumed that write data of 'LLLLHHHH' is written into a data area in which pre-read data of 'LHHLHLHL' has been stored.

FIG. 12A shows typical operations carried out in the write operation for a case in which the so-called pre-processing is performed. In this case, the pre-read data of 'LHHLHLHL' is compared with the write data of 'LLLLHHHH' to be written into a data area. On the basis of the result of the comparison, the mask generating block 341 generates an erase mask used for erasing only specific bits of the pre-read data to the L level in the pre-processing. A specific bit of the pre-read data is a bit that needs to be set eventually to the L level. Thus, a specific bit of the pre-read data is located at a position corresponding to the position of an H bit of the pre-read data and the position of an L bit of the write data. That is to say, the mask generating block 341 generates an erase mask of 'MEEMMMMM' for erasing only each of H bits of the pre-read data to the L level. An E bit in the erase mask is a bit for erasing the corresponding H bit of the pre-read data to the L level whereas an M bit in the erase mask is a bit for preventing the corresponding L bit of the pre-read data from being wastefully erased to the L level. The bit operating block 315 applies this erase mask to the pre-read data in order to generate erase-masked data of 'LLLLHLHL.'

By the same token, on the basis of the result of comparing the pre-read data of 'LHHLHLHL' with the write data of 'LLLLHHHH,' the mask generating block 341 generates a program mask used for programming only particular bits of the erase-masked data to the H level in the so-called post-processing. A particular bit of the erase-masked data is a bit that needs to be set eventually to the H level. Thus, a particular bit of the erase-masked data is located at a position corresponding to the position of an L bit of the erase-masked data and the position of an H bit of the write data. That is to say, the mask generating block 341 generates a program mask of 'MMMMMPMP' for programming only each of L bits of the erase-masked data to the H level. A P bit in the program mask is a bit for programming the corresponding L bit of the erase-masked data to the H level whereas an M bit in the program mask is a bit for preventing the corresponding H bit of the erase-masked data from being wastefully programmed to the H level. The bit operating block 315 applies this program mask to the erase-masked data in order to store the write data of 'LLLLHHHH' into the data area serving as the object of the write operation.

FIG. 12B shows typical operations carried out in the write operation for a case in which the pre-processing is not performed. Since the typical operations shown in FIG. 12B are identical with those shown in FIG. 4B, the typical operations shown in FIG. 12B are not explained again in detail.

In the embodiment described above, the pre-processing is carried out in order to erase only specific bits of the pre-read data to the L level. As explained before, a specific bit of the pre-read data is a bit that needs to be set eventually to the L level. It is to be noted, however, that the pre-processing can also be carried out in order to program only specific bits of the pre-read data to the H level. In this case, a specific bit of the pre-read data is a bit that needs to be set eventually to the H level.

As described above, in accordance with the fourth embodiment of the present disclosure, when the pre-processing is not to be omitted, both the pre-read data and the write data are referred to in order to carry out the erase operation and the program operation. Thus, only the specific bits of the pre-read data and the particular bits of the erase-masked data can be taken as objects of the erase operation and the program operation respectively.

5. Fifth Embodiment

In the embodiments described above, a verify operation is carried out after the erase operation in order to verify the result of the erase operation. By the same token, another verify operation is also carried out after the program operation in order to verify the result of the program operation. In the case of a fifth embodiment of the present disclosure, on the other hand, the verify operation and the other verify operation are carried out at the same time as follows.

[Operations of the Information Processing System]

Figure 13:
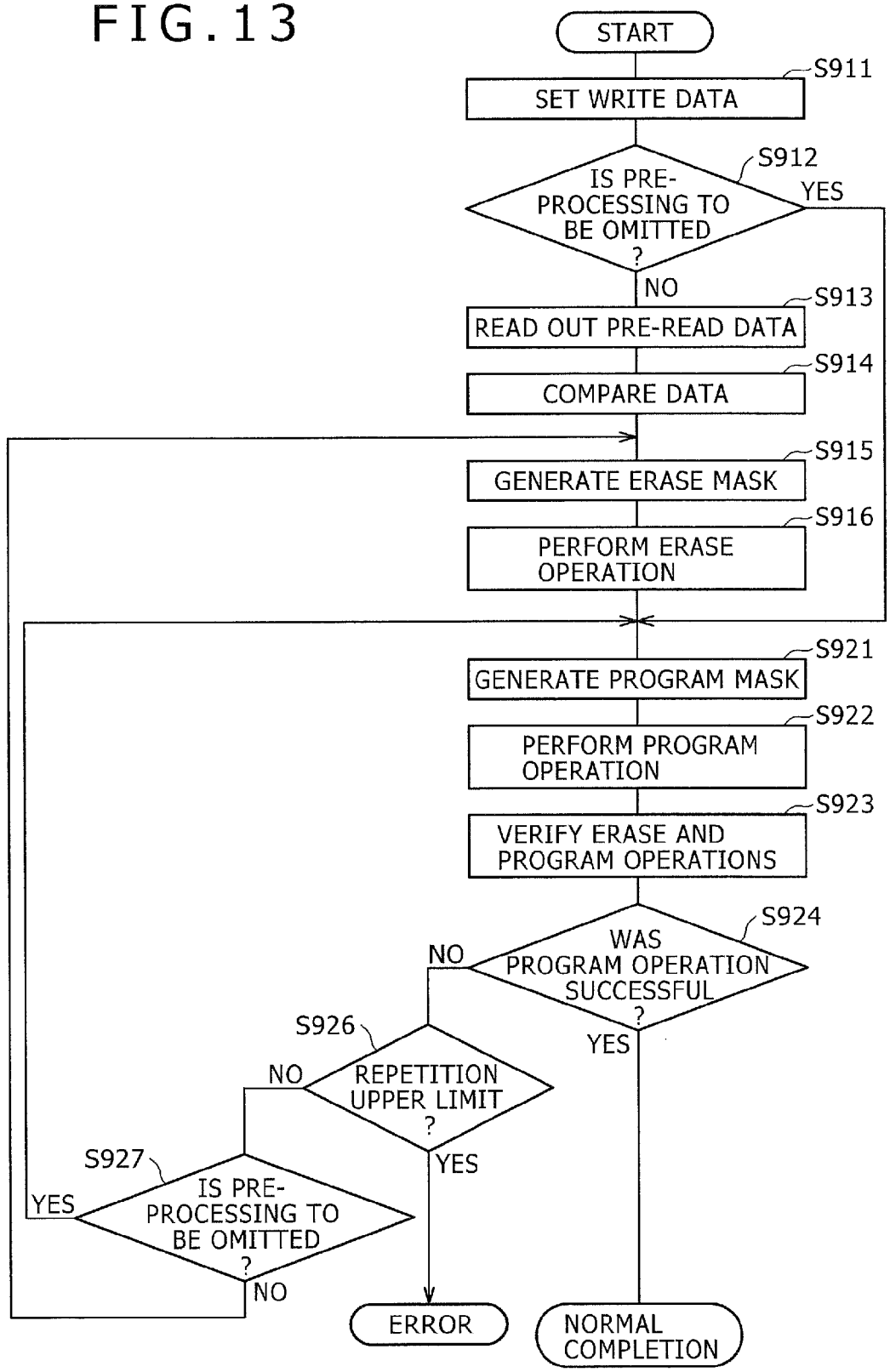
FIG. 13 is a flowchart representing a typical write-operation procedure adopted in an information processing system according to a fifth embodiment of the present disclosure.

FIG. 13 is a flowchart representing a typical write-operation procedure adopted in an information processing system according to the fifth embodiment of the present disclosure. In this typical write-operation procedure, it is assumed that an erase operation is carried out as pre-processing and, then, a program operation is carried out as post-processing. The basic operation procedure is identical with the procedure explained earlier by referring to the flowchart shown in FIG. 6 as a typical write-operation procedure adopted in the first embodiment of the present disclosure.

Steps S911 to S916 are identical with those of the flowchart shown in FIG. 6. In the case of the flowchart shown in FIG. 13, however, a verify operation is carried out not right after the erase operation performed as the pre-processing. Instead, the program operation is carried out as the post-processing at steps S921 and S922 right after the erase operation. Then, at the next step S923, operations to verify results of the erase operation and the program operation are carried out at the same time.

Subsequently, at the next step S924, the results of the verify operations carried out at the step S923 are examined in order to determine whether or not the erase operation and the program operation have been performed successfully. If the result of the examination carried out at the step S924 is Yes indicating that the verify operations carried out at the step S923 to verify the erase operation and the program operation have been performed successfully, the write operation is ended normally. If the result of the examination carried out at the step S924 is No indicating that the verify operations carried out at the step S923 to verify the erase operation and the program operation have been performed not successfully, on the other hand, the flow of the write-operation procedure goes on to a step S926 in order to determine whether or not the program and verify operations have been carried out a predetermined number of times in an attempt to repeat the erase, program and verify operations. If necessary, the erase, program and verify operations are carried out repeatedly till the result of the determination carried out at the step S926 becomes Yes indicating that the program and verify operations have been carried out the predetermined number of times. As the result of the determination carried out at the step S926 becomes Yes, the existence of a bad memory cell or a bad page is determined. In this case, the write-operation procedure is terminated by indicating detection of an error caused by the bad memory cell or the bad page.

As described above, when the erase operation and the program operation have been performed not successfully, the flow of the write-operation procedure goes on to the step S926. If the result of the determination carried out at the step S926 is No indicating that the program and verify operations have not been carried out the predetermined number of times, the flow of the procedure goes on to a step S927 at which the pre-processing-execution determining block 351 determines whether or not the pre-processing is to be omitted. If the pre-processing-execution determining block 351 produces a determination result of No at the step S927 to indicate that the pre-processing is to be carried out, the operations of steps S915 to S923 are carried out. If the pre-processing-execution determining block 351 produces a determination result of Yes at the step S927 to indicate that that the pre-processing is to be omitted, on the other hand, the operations of the steps S915 and S916 are skipped. That is to say, in this case, only the operations of a step S921 and the subsequent steps are carried out.

Figure 14:
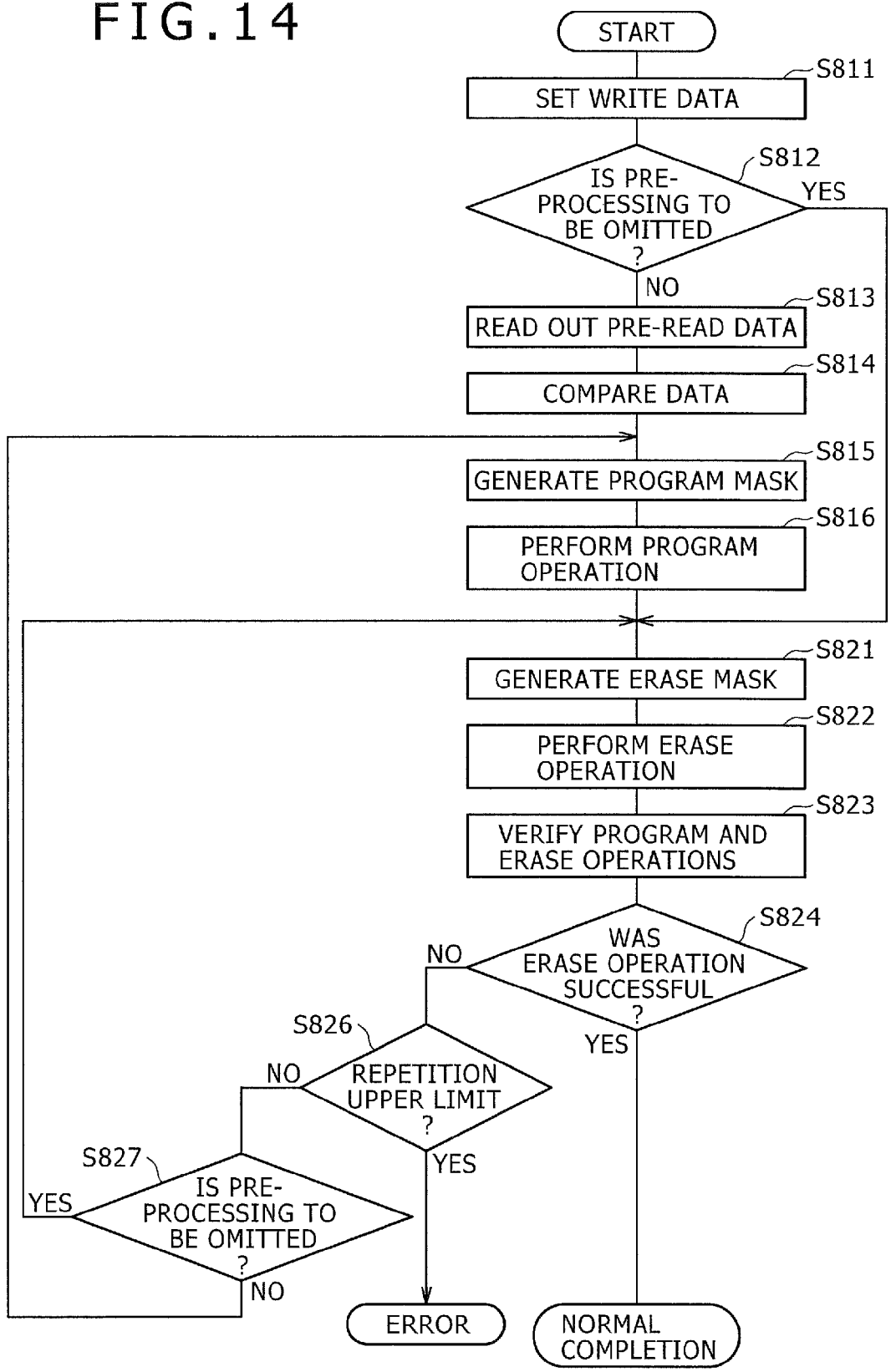
FIG. 14 is a flowchart representing a modified write-operation procedure adopted in the information processing system according to the fifth embodiment of the present disclosure.

FIG. 14 is a flowchart representing a modified write-operation procedure adopted in the information processing system according to the fifth embodiment of the present disclosure. In this typical write-operation procedure, it is assumed that a program operation is carried out as pre-processing and, then, an erase operation is carried out as post-processing. The basic operation procedure is identical with the procedure explained above by referring to the flowchart shown in FIG. 13.

Steps S811 to S816 are identical with those of the flowchart shown in FIG. 7. In the case of the flowchart shown in FIG. 14, however, a verify operation is carried out not right after the program operation performed as the pre-processing. Instead, the erase operation is carried out as the post-processing at steps S821 and S822 right after the program operation. Then, at the next step S823, operations to verify results of the program operation and the erase operation are carried out at the same time.

Subsequently, at the next step S824, the results of the verify operations carried out at the step S823 are examined in order to determine whether or not the erase operation and the program operation have been performed successfully. If the result of the examination carried out at the step S824 is Yes indicating that the verify operations carried out at the step S823 to verify the erase operation and the program operation have been performed successfully, the write operation is ended normally. If the result of the examination carried out at the step S824 is No indicating that the verify operations carried out at the step S823 to verify the erase operation and the program operation have been performed not successfully, on the other hand, the flow of the write-operation procedure goes on to a step S826 in order to determine whether or not the erase and verify operations have been carried out a predetermined number of times in an attempt to repeat the program, erase and verify operations. If necessary, the program, erase and verify operations are carried out repeatedly till the result of the determination carried out at the step S826 becomes Yes indicating that the erase and verify operations have been carried out the predetermined number of times. As the result of the determination carried out at the step S826 becomes Yes, the existence of a bad memory cell or a bad page is determined. In this case, the write-operation procedure is terminated by indicating detection of an error caused by the bad memory cell or the bad page.

As described above, when the erase operation and the program operation have been performed not successfully, the flow of the write-operation procedure goes on to the step S826. If the result of the determination carried out at the step S826 is No indicating that the erase and verify operations have not been carried out the predetermined number of times, the flow of the procedure goes on to a step S827 at which the pre-processing-execution determining block 351 determines whether or not the pre-processing is to be omitted. If the pre-processing-execution determining block 351 produces a determination result of No at the step S827 to indicate that the pre-processing is to be carried out, the operations of steps S815 to S823 are carried out. If the pre-processing-execution determining block 351 produces a determination result of Yes at the step S827 to indicate that that the pre-processing is to be omitted, on the other hand, the operations of the steps S815 and S816 are skipped. That is to say, in this case, only the operations of a step S821 and the subsequent steps are carried out.

As described above, in accordance with the fifth embodiment, typical operations to verify results of the program operation and the erase operation are carried out at the same time. Thus, the write operation can be carried out in a short period of time. As explained above, the typical operations to verify results of the program operation and the erase operation are carried out at the same time for the write operation according to the first embodiment. It is to be noted, however, that the typical verify operations can also be carried out at the same time for the write operation according to the other embodiments including the fourth embodiment.

The size of data stored in the NVRAM to serve as an object of the erase operation is equal to the size of data stored in the NVRAM to serve as an object of the write operation from the beginning. Thus, by making use of an NVRAM in an SSD, there is no case in which garbage collection is generated much like a NAND-type SSD which is an SSD employing a NAND-type flash memory. Thus, in comparison with the NAND-type SSD, the performance of the SSD making use of the NVRAM can be much improved. By adoption of the present technology, however, the speed of the write operation can be further increased.

In recent years, in the same way as the video applications, the number of pixels used in a digital still camera has also been increasing substantially. A storage device employed in the digital still camera is also required to allow operations to write data thereto to be carried out at a high speed. By adoption of the present technology, it is expected that the continuous shooting performance and the like can be improved considerably. In addition, as a spin-off, a high-speed write operation can be implemented when an operation is carried out to write data into a storage device after buffering the data in a DRAM employed in the imaging system. Since the high-speed write operation can be implemented, the storage capacity of the DRAM buffer can be reduced. Thus, a low-price effect and a low-power-consumption effect can be expected.

It is to be noted that each embodiment described above is merely a typical implementation of the present disclosure. Each item of the embodiment is associated with a specific item of the disclosure described in claims. By the same token, each specific item of a disclosure described in a claim is associated with an item included in the embodiment and referred to as the same name as the specific item of the disclosure. However, the scope of the present disclosure is by no means limited to the embodiments. That is to say, in order to implement the present disclosure, the embodiments can be changed in a variety of ways within a range not deviating from essentials of the present disclosure.

In addition, each processing procedure explained in the descriptions of the embodiments can be interpreted as a method for carrying out operations sequentially. As an alternative, the sequence of operations can be carried out by a computer for executing a program stored in a recording medium. Typical examples of the recording medium are a CD (Compact Disc), an MD (Mini Disc), a DVD (Digital Versatile Disk), a memory card and a Blu-ray Disc (a trademark), to mention a few.

It is to be noted that the present disclosure can also be realized as the following implementations.

(1) A storage control apparatus including:

a pre-processing-execution determining block configured to determine whether or not either one of an erase operation and a program operation is to be executed as pre-processing in a write operation to be carried out on a predetermined data area included in a memory cell to serve as a write-operation object;

a pre-read processing block configured to read out pre-read data from the data area included in the memory cell to serve as a write-operation object prior to the write operation if a result of the determination indicates that the pre-processing is to be executed; and a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed.

(2) The storage control apparatus according to implementation (1) wherein in every bit of the memory cell, a first value or a second value can be stored, and the pre-processing is processing to set the first value in each of the bits of the memory cell whereas the post-processing is processing to set the second value in any of the bits of the memory cell.

(3) The storage control apparatus according to implementation (1) wherein the pre-processing-execution determining block determines whether or not an erase operation or a program operation is to be executed on the basis of a control signal received from an external source.

(4) The storage control apparatus according to implementation (1), further including a flag holding section configured to hold an erase flag, which indicates that an erase operation has been completed, for every predetermined data area of the memory cell, wherein the pre-processing-execution determining block determines that:

the pre-processing is not to be executed on a data area included in a memory cell to serve as a write-operation object if the erase flag indicates that the erase operation has been completed for the data area; and the pre-processing is to be executed on a data area included in a memory cell to serve as a write-operation object if the erase flag does not indicate that the erase operation has been completed for the data area.

(5) The storage control apparatus according to implementation (1) wherein when a command having a field used for indicating whether or not the pre-processing is to be executed is issued, the pre-processing-execution determining block refers to the field in order to determine whether or not the pre-processing is to be executed.

(6) The storage control apparatus according to implementation (1), further including a processor configured to carry out an erase operation on an unused data area reported by a received command in accordance with the received command, wherein the pre-processing-execution determining block determines that the pre-processing is not to be executed on a data area included in a memory cell to serve as a write-operation object if the erase operation has been completed for the data area in accordance with the command.

(7) The storage control apparatus according to implementation (1), further including a processor configured to carry out an erase operation on a data area specified in a received command in accordance with the received command for erasing user data from the data area, wherein the pre-processing-execution determining block determines that the pre-processing is not to be executed on a data area included in a memory cell to serve as a write-operation object if the erase operation has been completed for the data area in accordance with the command.

(8) A storage apparatus including:

a memory cell;

a pre-processing-execution determining block configured to determine whether or not either one of an erase operation and a program operation is to be executed as pre-processing in a write operation to be carried out on a predetermined data area included in the memory cell to serve as a write-operation object;

a pre-read processing block configured to read out pre-read data from the data area included in the memory cell to serve as a write-operation object prior to the write operation if a result of the determination indicates that the pre-processing is to be executed; and a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed.

(9) The storage apparatus according to implementation (8) wherein the memory cell is a variable-resistance device.

(10) An information processing system including:

a memory cell;

a pre-processing-execution determining block configured to determine whether or not either one of an erase operation and a program operation is to be executed as pre-processing in a write operation to be carried out on a predetermined data area included in the memory cell to serve as a write-operation object;

a pre-read processing block configured to read out pre-read data from the data area included in the memory cell to serve as a write-operation object prior to the write operation if a result of the determination indicates that the pre-processing is to be executed;

a bit operating block configured to carry out the pre-processing and one of the erase and program operations which is not the pre-processing as post-processing if a result of the determination indicates that the pre-processing is to be executed, and the post-processing without carrying out the pre-processing if a result of the determination indicates that the pre-processing is not to be executed; and a host computer configured to issue a read command or a write command to the memory cell.

(11) A storage control method including:

determining whether or not either one of an erase operation and a program operation is to be executed as pre-processing in a write operation to be carried out on a predetermined data area included in a memory cell to serve as a write-operation object;

reading out pre-read data from the data area included in the memory cell to serve as a write-operation object prior to the write operation if a result of the determination indicates that the pre-processing is to be executed; and carrying out the pre-processing and one of the erase and program operations which is not the pre-processing as post-processing if a result of the determination indicates that the pre-processing is to be executed, and carrying out the post-processing without carrying out the pre-processing if a result of the determination indicates that the pre-processing is not to be executed.

What is claimed is:

1. A storage control apparatus, comprising:
a memory configured to store instructions; and
at least one processor coupled to the memory, wherein the at least one processor is configured to:
  determine a pre-processing operation, which includes at least one of an erase operation or a program operation, is omitted based on a storage of a value in a data area of a memory cell, wherein the memory cell serves as an object of a write-operation;
  select at least one of the erase operation or the program operation as a post-processing operation based on data read out from the memory cell and the determination; and
  hold an erase flag for the data area of the memory cell,
    wherein the pre-processing operation is omitted on the data area included in the memory cell, based on the erase flag which indicates completion of the erase operation for the data area, and
    wherein the pre-processing operation is executed on the data area included in the memory cell, based on the erase flag which indicates that the erase operation is incomplete for the data area.

2. The storage control apparatus according to claim 1, wherein bits of the memory cell are configured to store a first value or a second value, and
wherein the pre-processing operation comprises a first process to set the first value in each of the bits of the memory cell and the post-processing operation comprises a second process to set the second value in the bits of the memory cell.

3. The storage control apparatus according to claim 1, wherein the at least one processor is further configured to determine that one of the erase operation or the program operation is executed based on a control signal received from an external source.

4. The storage control apparatus according to claim 1, wherein the at least one processor is further configured to determine that the pre-processing operation is to be executed based on an issuance of a command, and
wherein the command comprises a field to indicate the pre-processing operation is to be executed.

5. The storage control apparatus according to claim 1, wherein the at least one processor is further configured to erase, by the erase operation, an unused data area based on a received command, and
wherein the pre-processing operation is omitted on the data area included in the memory cell, based on a completion of the erase operation.

6. The storage control apparatus according to claim 1, wherein the at least one processor is further configured to erase, by the erase operation, a specified data area based on a received command,
wherein the received command is configured to erase user data from the specified data area, and wherein the pre-processing operation is omitted on the data area included in the memory cell, based on a completion of the erase operation for the specified data area.

7. A storage apparatus, comprising:
a memory cell configured to store instructions;
a pre-read processing block configured to read out data from the memory cell;
a bit operating block configured to select at least one of an erase operation or a program operation as a post-processing operation based on the data read out from the memory cell and a command,
wherein the command causes omission of a pre-processing operation, based on a storage of a value in a data area of the memory cell,
wherein the pre-processing operation comprises at least one of the erase operation or the program operation, and
wherein the memory cell serves as an object of a write-operation; and
a control register configured to hold an erase flag for the data area of the memory cell,
wherein the pre-processing operation is omitted on the data area included in the memory cell, based on the erase flag which indicates completion of the erase operation for the data area, and
wherein the pre-processing operation is executed on the data area included in the memory cell, based on the erase flag which indicates that the erase operation is incomplete for the data area.

8. The storage apparatus according to claim 7, wherein the memory cell is a variable-resistance device.

9. An information processing system, comprising:
a memory cell configured to store instructions;
a pre-read processing block configured to read out data from the memory cell;
a bit operating block configured to select at least one of an erase operation or a program operation as a post-processing operation based on the data read out from the memory cell and a command,
wherein the command causes omission of a pre-processing operation, based on a storage of a value in a data area of the memory cell,
wherein the pre-processing operation comprises at least one of the erase operation or the program operation, and
wherein the memory cell serves as an object of a write-operation; and
a control register configured to hold an erase flag for a data area of the memory cell,
wherein the pre-processing operation is omitted on the data area included in the memory cell, based on the erase flag which indicates completion of the erase operation for the data area, and
wherein the pre-processing operation is executed on the data area included in the memory cell based on the erase flag which indicates that the erase operation is incomplete for the data area.

10. A storage control method, comprising:
in a storage control apparatus comprising a processor:
determining, by the processor, a pre-processing operation is omitted based on a storage of a value in a data area of a memory cell,
wherein the pre-processing operation comprises at least one of an erase operation or a program operation,
wherein the memory cell serves as an object of a write-operation;
selecting, by the processor, at least one of the erase operation or the program operation as a post-processing operation based on data read out from the memory cell and the determination; and
holding an erase flag for the data area of the memory cell,
wherein the pre-processing operation is omitted on the data area included in the memory cell, based on the erase flag which indicates completion of the erase operation for the data area, and
wherein the pre-processing operation is executed on the data area included in the memory cell, based on the erase flag which indicates that the erase operation is incomplete for the data area.

11. The storage control method according to claim 10, wherein bits of the memory cell are configured to store a first value or a second value, and
wherein the pre-processing operation comprises a first process to set the first value in each of the bits of the memory cell and the post-processing operation comprises a second process to set the second value in the bits of the memory cell.

12. The storage control method according to claim 10, wherein the determination that the erase operation or the program operation is to be executed is based on a control signal received from an external source.

13. The storage control method according to claim 10, wherein an issuance of a command determines whether the pre-processing operation is to be executed, and
wherein the command comprises a field used for indicating whether the pre-processing operation is to be executed.

14. The storage control method according to claim 10, further comprising:
erasing, by the erase operation, an unused data area based on a received command,
wherein the determination that the pre-processing operation is to be omitted on the data area included in the memory cell that serves as the object of the write-operation, is based on a completion of the erase operation for the unused data area.

15. The storage control method according to claim 10, further comprising:
erasing, by the erase operation, a specified data area based on a received command,
wherein the received command is configured to erase user data from the specified data area,
wherein the determination that the pre-processing operation is to be omitted on the data area included in the memory cell that serves as the object of the write-operation, is based on a completion of the erase operation for the specified data area.

16. The information processing system according to claim 9, wherein the memory cell is a variable-resistance device.

* * * * *